(12) United States Patent
Imai et al.

(10) Patent No.: US 9,368,385 B2
(45) Date of Patent: Jun. 14, 2016

(54) MANUFACTURING METHOD FOR SEMICONDUCTOR INTEGRATED CIRCUIT DEVICE

(71) Applicant: Renesas Electronics Corporation, Kawasaki-shi, Kanagawa (JP)

(72) Inventors: Akira Imai, Kanagawa (JP); Toshiaki Iwamatsu, Kanagawa (JP); Akihiro Nakae, Kanagawa (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 445 days.

(21) Appl. No.: 13/781,737

(22) Filed: Feb. 28, 2013

(65) Prior Publication Data

US 2013/0230964 A1    Sep. 5, 2013

(30) Foreign Application Priority Data

Mar. 1, 2012    (JP) ................. 2012-045346

(51) Int. Cl.
| | |
|---|---|
| H01L 21/76 | (2006.01) |
| H01L 21/68 | (2006.01) |
| H01L 27/12 | (2006.01) |
| H01L 23/544 | (2006.01) |
| H01L 21/762 | (2006.01) |
| H01L 21/3105 | (2006.01) |

(52) U.S. Cl.
CPC ............... *H01L 21/76* (2013.01); *H01L 21/68* (2013.01); *H01L 21/76229* (2013.01); *H01L 21/76283* (2013.01); *H01L 23/544* (2013.01); *H01L 27/1207* (2013.01); *H01L 21/31053* (2013.01); *H01L 21/31056* (2013.01); *H01L 2223/5442* (2013.01); *H01L 2223/5446* (2013.01); *H01L 2223/54426* (2013.01); *H01L 2924/0002* (2013.01)

(58) Field of Classification Search
None
See application file for complete search history.

(56) References Cited

U.S. PATENT DOCUMENTS

| | | | |
|---|---|---|---|
| 7,005,755 B2 | 2/2006 | Yoshimura et al. | |
| 2003/0008472 A1 | 1/2003 | Yoshimura et al. | |
| 2004/0135226 A1 | 7/2004 | Yoshimura et al. | |
| 2008/0237695 A1* | 10/2008 | Shino | G11C 11/404 257/324 |
| 2012/0018807 A1* | 1/2012 | Tsuchiya et al. | 257/347 |

FOREIGN PATENT DOCUMENTS

| | | |
|---|---|---|
| JP | 07-211610 A | 8/1995 |
| JP | 10-303385 A | 11/1998 |
| JP | 2004-047844 A | 2/2004 |
| JP | 2007-184549 A | 7/2007 |
| WO | WO 01/67509 A1 | 9/2001 |

\* cited by examiner

*Primary Examiner* — Seahvosh Nikmanesh
(74) *Attorney, Agent, or Firm* — Shapiro, Gabor and Rosenberger, PLLC

(57) ABSTRACT

A method for manufacturing a semiconductor integrated circuit device includes the step of forming an SOI device region and a bulk device region on an SOI type semiconductor wafer. The method includes: removing a BOX layer and an SOI layer in a bulk device region; and thereafter forming an STI region in both the SOI device region and the bulk device region. In the method, the STI region in the SOI device region is formed to extend through the BOX layer.

14 Claims, 27 Drawing Sheets

MANUFACTURING METHOD FOR
SEMICONDUCTOR INTEGRATED CIRCUIT
DEVICE

CROSS-REFERENCE TO RELATED
APPLICATIONS

The Present application claims priority from Japanese application JP 2012-045346 filed on Mar. 1, 2012, the content of which is hereby incorporated by reference into this application.

BACKGROUND

The present invention relates to a method for manufacturing a semiconductor integrated circuit device (or semiconductor device), and in particular, a technique useful in applications to semiconductor devices having an SOI structure.

JP-A-10-303385 (Patent Document 1), has disclosed a technique for exposing a silicon substrate in a region constituting a part of the SOI substrate, namely a bulk device region, forming a memory cell region of DRAM (Dynamic Random Access Memory) in the bulk device region, and forming a logic region in a region where the silicon substrate is not exposed, namely SOI device region.

JP-A-2007-184549 (Patent Document 2) has disclosed a technique for burying a device isolation insulative film in parallel with burying an insulative film in a cavity portion to make an underlying oxide film in the case of forming, from a single-crystal silicon substrate or the like, a device having a bulk device region and a device region.

JP-A-2004-47844 (Patent Document 3) has disclosed a technique for exposing a silicon substrate in a bulk device region of a SOI substrate, causing an epitaxial silicon layer to grow in the region, and then forming an STI (Shallow Trench Isolation) region.

WO2001/067509 (Patent Document 4) and U.S. Pat. No. 7,005,755 (Patent Document 5) corresponding thereto have disclosed a technique for forming an alignment mark for superposition of a pattern in a part of an SOI substrate where an SOI layer and a BOX layer are removed.

JP-A-07-211610 (Patent Document 6) has disclosed a technique in forming an alignment mark for superposition of a pattern in an SOI substrate, by which an alignment mark is formed by removing an SOI layer and a BOX layer, and etching an underlying substrate.

SUMMARY

With regard to a hybrid type SOI semiconductor integrated circuit device having an SOI device region and a bulk device region on an SOI substrate, an SOI layer and a BOX layer are removed in a region to form the bulk device region after the formation of an STI (Shallow Trench Isolation) insulative film, in general. However, such process has a problem that a step, i.e. the difference in height between the upper face of the STI insulative film and the upper face of the semiconductor substrate, becomes significant in the bulk device region.

The means for solving a problem like this will be described below. However, other problems and novel features thereof will become clear from the description hereof and the accompanying drawings.

Of the embodiments herein disclosed, a representative embodiment will be briefly outlined below.

A method for manufacturing a semiconductor integrated circuit device according to the representative embodiment of the invention includes forming an SOI device region and a bulk device region on an SOI type semiconductor wafer. In the method, a BOX layer and an SOI layer are removed in the bulk device region before forming an STI region in the device regions. In the method, the STI region is formed to extend through the BOX layer in the SOI device region.

The effect achieved by the representative embodiment herein disclosed is as follows.

In the method for manufacturing a semiconductor integrated circuit device which includes forming an SOI device region and a bulk device region on an SOT type semiconductor wafer, a BOX layer and an SOI layer are removed in the bulk device region before forming an STI region in the device regions. The STI region is formed to extend through the BOX layer in the SOI device region. Therefore, it becomes possible to provide a device isolation structure with smaller steps, which is suitable for fine devices.

DETAILED DESCRIPTION

Summary of the Embodiments

Figure 1:
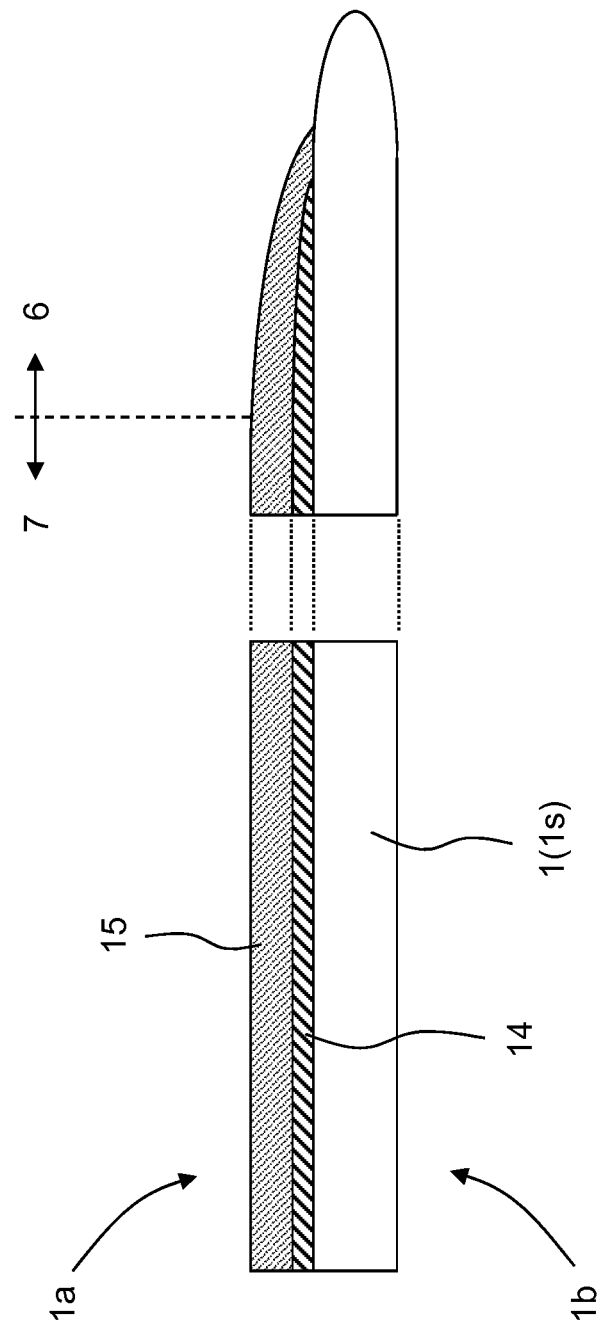
FIG. 1 is a sectional view for explaining an important part of the wafer process in a method for manufacturing a semiconductor integrated circuit device (in the BOX & SOI layers-removing preceding process) according to one embodiment hereof, showing wafer-inward and -peripheral regions (the step of SOI wafer introduction)

The summary of the representative embodiment herein disclosed will be described first.

1. The method for manufacturing a semiconductor integrated circuit device includes the steps of:

(a) removing an SOI layer and a BOX layer in a part to make a bulk device region in each chip region on a first principal face side of an SOI type semiconductor wafer;

(b) after the step (a), forming a first STI region to extend through the BOX layer in a part to make an SOI device region in each chip region on the first principal face side of the SOI type semiconductor wafer, and forming a second STI region in the bulk device region in each chip region on the first principal face side of the SOI type semiconductor wafer; and (c) after the step (b), forming MISFETs in the SOI device region and the bulk device region respectively.

2. In regard to the method for manufacturing a semiconductor integrated circuit device as described in the above item No. 1, a lower end portion of the second STI region is lower than that of the first STI region.

3. In regard to the method for manufacturing a semiconductor integrated circuit device as described in the above item No. 1 or 2, the step (c) includes the subsequent step of: (c1) patterning a gate electrode of the MISFET.

4. In regard to the method for manufacturing a semiconductor integrated circuit device as described in any one of the above item Nos. 1 to 3, the step of forming an epitaxial semiconductor layer at least on the bulk device region is not included after the step (a) and before the step (b).

5. in regard to the method for manufacturing a semiconductor integrated circuit device as described in any one of the above items Nos. 1 to 4, the step (b) further includes: forming an alignment mark to use in the step (c) in a dicing region on the first principal face side of the SOI type semiconductor wafer, the region having the SOI and BOX layers removed therefrom.

6. In regard to the method for manufacturing a semiconductor integrated circuit device as described in the above item No. 5, the alignment mark is mainly composed of an STI insulative film formed concurrently with formation of the first and second STI regions.

7. In regard to the method for manufacturing a semiconductor integrated circuit device as described in any one of the above items Nos. 1 to 6, the step (a) further includes: removing the SOI and BOX layers in a wafer-peripheral region on the first principal face side of the SOI type semiconductor wafer.

8. In regard to the method for manufacturing a semiconductor integrated circuit device as described in the above item No. 7, a part to remove the SOI and BOX layers from the wafer-peripheral region is defined by peripheral exposure.

9. In regard to the method for manufacturing a semiconductor integrated circuit device as described in the above item No. 7, a part to remove the SOI and BOX layers from the wafer-peripheral region is defined by exposure using a mask pattern.

10. In regard to the method for manufacturing a semiconductor integrated circuit device as described in the above item No. 8, the peripheral exposure is executed before a primary exposure for defining the bulk device region in each chip region.

11. The method for manufacturing a semiconductor integrated circuit device includes the steps of:

(a) removing an SOI layer and a BOX layer in a part to make a bulk device region in each chip region on a first principal face side of an SOI type semiconductor wafer;

(b) after the step (a), forming a first STI region in a part to make an SOI device region in each chip region on the first principal face side of the of the SOI type semiconductor wafer, and forming a second STI region in the bulk device region in each chip region on the first principal face side of the SOI type semiconductor wafer; and (c) after the step (b), forming MISFETs in the SOI device region and the bulk device region respectively.

In the method, the step of forming an epitaxial semiconductor layer at least on the bulk device region is not included after the step (a) and before the step (b).

12. In regard to the method for manufacturing a semiconductor integrated circuit device as described in the above item No. 11, a lower end portion of the second STI region is lower than that of the first STI region.

13. In regard to the method for manufacturing a semiconductor integrated circuit device as described in the above item No. 11 or 12, the step (c) includes the subsequent step of: (c1) patterning a gate electrode of the MISFET.

14. In regard to the method for manufacturing a semiconductor integrated circuit device as described in any one of the above items Nos. 11 to 13, the step (b) further includes: forming an alignment mark to use in the step (c) in a dicing region on the first principal face side of the SOI type semiconductor wafer, the region having the SOI and BOX layers removed therefrom.

15. In regard to the method for manufacturing a semiconductor integrated circuit device as described in the above item No. 14, the alignment mark is mainly composed of an STI insulative film formed concurrently with formation of the first and second STI regions.

16. In regard to the method for manufacturing a semiconductor integrated circuit device as described in any one of the above items Nos. 11 to 15, the step (a) further includes: removing the SOT and BOX layers in a wafer-peripheral region on the first principal face side of the SOI type semiconductor wafer.

17. in regard to the method for manufacturing a semiconductor integrated circuit device as described in the above item No. 16, a part to remove the SOT and BOX layers from the wafer-peripheral region is defined by peripheral exposure.

18. in regard to the method for manufacturing a semiconductor integrated circuit device as described in the above item No. 16, a part to remove the SOI and BOX layers from the wafer-peripheral region is defined by exposure using a mask pattern.

19. In regard to the method for manufacturing a semiconductor integrated circuit device as described in the above item No. 17, the peripheral exposure is executed before a primary exposure for defining the bulk device region in each chip region.

[The Description Format Hereof, and Explanation of Basic Terms, and Use Thereof]

1. The description of the embodiment herein is divided into two or more sections on an as-needed basis for convenience in some cases. However, the sections are not independent of each other, and they cover a part of one embodiment, a detailed part of the other part, or a part or all of a modification thereof, unless clearly stated as not being so in particular. The iteration of the description concerning like parts is avoided in principle. Further, each constituent of one embodiment is not essential unless clearly stated as not being so in particular, limited to that number theoretically, or clearly judged as not being so from the context.

Further, the word "semiconductor device" or "semiconductor integrated circuit device" used herein primarily refers to a device in which a semiconductor chip or the like, e.g. a single-crystal silicon substrate has various kinds of discrete transistors (active elements), and resistors, capacitors and other elements arranged around the transistors integrated thereon, or a device into which such semiconductor chip is packaged. The representative examples of the various transistors include MISFET (Metal Insulator Semiconductor Field Effect Transistor) typified by MOSFET (Metal Oxide Semiconductor Field Effect Transistor). The representative examples of the integrated circuit structures include a CMIS (Complementary Metal Insulator Semiconductor) type integrated circuit typified by a CMOS (Complementary Metal Oxide Semiconductor) type integrated circuit having a combination of an N-channel type MISFET and a P-channel type MISFET.

The wafer process of today's semiconductor integrated circuit device, namely LSI (Large Scale Integration) is usually considered being divided into two phases. Specifically, the first one is FEOL (Front End of Line) phase. The FEOL phase is composed of steps, i.e. from the step of loading a silicon wafer as a primary material roughly to a group of premetal steps (including the step of forming an interlayer insulative film, etc. between the lower end of a M1 wiring layer and a gate electrode structure, the step of forming a contact hole, and the step of burying a tungsten plug). The second one is BEOL (Back End of Line) phase. The BEOL phase is composed of steps, i.e. from the step of forming the M1 wiring layer roughly to the step of forming a pad opening in a final passivation film on an aluminum-based pad electrode (if a wafer-level packaging is present, including the step of packaging).

2. Likewise, in the descriptions of the embodiment and others, the expression "X including A" concerning a material, a composition or the like is not intended to exclude that X includes an element other than A as one of main constituents, unless clearly stated as not being so in particular, or clearly judged as not being so from the context. In terms of the constituents, for example, it means "X including A as a main constituent". Further, e.g. "silicon member" is not limited to pure silicon. It is obvious that it includes members including a SiGe alloy, other multi-element alloys having silicon as main constituents, other additives, etc.

Likewise, "silicon oxide film" and "silicon oxide-based insulative film" each include not only relatively pure undoped silicon dioxide, but also other insulative films having other silicon oxides as a main constituent. Impurity-doped silicon oxide-based insulative films of e.g. TEOS-based silicon oxide, PSG (Phosphorus Silicate Glass), and BPSG (Borophosphosilicate Glass) are also silicon oxide films.

Also, coating films of an SOG (Spin On Glass), an NSC (Nano-Clustering Silica), and the like as well as a thermal oxide film and a CVD oxide film are a silicon oxide film or a silicon oxide-based insulative film. In addition, Low-k insulative films of an FSG (Fluorosilicate Glass), a SiOC (Silicon Oxicarbide) or a carbon-doped silicon oxide (Carbon-doped Silicon oxide), an OSG (Organosilicate Glass), and the like are also a silicon oxide films or a silicon oxide-based insulative film. Further, a silica-based Low-k insulative film (porous insulative film) formed by a like member having pores introduced thereinto is also a silicon oxide film or a silicon oxide-based insulative film.

As a silicon-based insulative film commonly used in a semiconductor field as well as a silicon oxide-based insulative film, a silicon nitride-based insulative film is included. The materials for such kind of films include SiN, SiCN, SiNH and SiCNH. Now, "silicon nitride" described herein includes both of SiN and SiNH unless clearly stated as not being so in particular. Likewise, "SiCN" includes both of SiCN and SiCNH unless clearly stated as not being so in particular.

Incidentally, SiC has properties similar to those of SiN. It is often the case that SiON should be rather classified as a silicon oxide-based insulative film.

A silicon nitride film is often used as an etching-stop film, namely a CESL (Contact Etch-Stop Layer) in SAC (Self-Aligned Contact) technology, and in addition it is also used as a stress-applying film in SMT (Stress Memorization Technique).

Likewise, "nickel silicide" usually refers to nickel monosilicide. However, it includes not only relatively pure nickel monosilicide, but also an alloy, a mixed crystal and other materials, which contain nickel monosilicide as a main constituent. The silicide may be not only nickel silicide, but also cobalt silicide, titaniumsilicide, tungsten silicide and the other materials, which have a track record in conventional use. In addition to a Ni (nickel) film, a nickel alloy film, e.g. a Ni—Pt alloy film (alloy film of Ni and Pt), a Ni—V alloy film (alloy film of Ni and V), a Ni—Pd alloy film (alloy film of Ni and Pd), a Ni—Yb alloy film (alloy film of Ni and Yb), or a Ni—Er alloy film (alloy film of Ni and Er) may be used as a metal film for silicification. The silicides having nickel as a primary metal element are referred to as "nickel-based silicide".

3. Likewise, the preferred embodiments will be shown in terms of figures, position and attributes. However, it is obvious that the invention is not strictly limited to the embodiments unless clearly stated as not being so in particular, or clearly judged as not being so from the context.

4. When citing a certain numerical value, or a certain numerical quantity, the certain numerical value or quantity may be a value above or below the certain value or quantity unless clearly stated as not being so in particular, limited to that number theoretically, or clearly judged as not being so from the context.

5. When using the word "wafer", the word refers to typically a monocrystalline silicon wafer which has a semiconductor integrated circuit device (or a semiconductor device, or an electronic device) formed thereon. However, it is obvious that what is referred to by the word includes an epitaxial wafer, and a complex wafer having an insulative substrate such as an SOI substrate or an LCD glass substrate, and a semiconductor layer or the like.

6. The various kinds of regions are handled herein, which include a region lying on a wafer or a surrounding region thereof (e.g. a chip region). However, some of these regions cannot be directly recognized as an externally appearing geometry depending on the step. However, such regions refer to a specific region located on a wafer in a position measured from a predetermined reference point, and forming an entity.

In addition, the various regions often used herein will be described briefly. "SOI device region" refers to a region where an SOI type transistor (i.e. a transistor formed on an SOI structure) is formed, and "bulk device region" refers to a region where a bulk type transistor (i.e. a transistor formed on a bulk region on a substrate) is formed.

Further, "STI region" refers to a region where an STI type device isolation insulative film, i.e. an STI insulative film is formed. Now, it is noted that "reverse oxide film etching" in connection with the STI process refers to a pre-CMP etching which is performed by use of a reverse etching mask (corresponding to a reverse pattern of a resist pattern for trench formation) having an opening a little smaller than the width of a targeted part so as to prevent a buried oxide film of the part corresponding to a relatively wide active region from excessively remaining. Then, the ratio of an opening size of the reverse etching mask (resist film) to the size of an actual targeted active region is sometimes referred to as "reverse-opening-size-reduction rate". However, while the word "reduction rate" is used, the reduction is not made at a fixed rate typically. A result from the subtraction of a fixed length such as an alignment margin from the size of an original active region is made the opening size (e.g. in the case of a uniform reduction method as described below). Therefore, as to a part corresponding to an active region which is equal to or less than two or three times the alignment margin in size, the opening size is zero. The description on the embodiments below covers the embodiment in which substantially the same reverse-opening-size-reduction rate is used for an SOI device region and a bulk device region, and the embodiment in which a smaller reverse-opening-size-reduction rate is used for a bulk device region (i.e. the opening size is made larger and possibly, a negative reduction rate may be used). In such cases, the method applied in the former embodiment is referred to as "uniform reduction method", and the method in the latter embodiment is referred to as "bulk-device-side-etching-amount-increasing method".

It is needless to say that the reverse oxide film etching is not essential unless clearly stated as being essential in particular.

Further, "wafer-peripheral region" refers to an annular region surrounding a wafer and ranging to a few millimeters radially, which is complementary to "wafer-inward region" in concept. In addition, it almost coincides with "peripheral exposure region" or "edge-rinse region" in the resist processing.

Likewise, "chip region" and "dicing region (scribing region)" are complementary to each other in concept. The "alignment mark formation region" is usually located in the dicing region. Now, it is needless to say that the "dicing region" is not limited to a region to be divided into chips by dicing.

In the embodiment described below, chiefly a "unit shot region" includes one chip region. However, it may include a plurality of chip regions. The "actual unit shot region" principally refers to a unit shot region corresponding to a chip region, which forms a product. The "dummy unit shot region" principally refers to a unit shot region located in the vicinity of the wafer-peripheral region where the "unit shot region"

lies out of the "wafer-inward region", which is to be subjected to the wafer peripheral exposure.

7. The "SOI type semiconductor wafer" herein refers to a wafer having an SOI structure on the almost entire surface of the wafer or a part thereof on the side of its front face. Here, the SOI structure generally refers to a structure such that a semiconductor thin film such as an SOI layer is formed on a thin insulative film such as a BOX layer on the front face side of a semiconductor substrate such as a silicon substrate. It is not intended that "BOX layer" is herein limited to a particular manufacturing method, which refers to an underlying insulative film of SOI layer in a wide sense. Further, it is not intended that "SOI layer" is limited to a silicon or silicon-based member. Except silicon and SiGe, it may be e.g. a germanium-based semiconductor member, or III-V group semiconductor member.

8. The word "peripheral exposure" herein refers to a main exposure, namely the exposure of a wafer-peripheral region, as one of wafer peripheral exposures, which is performed outside an aligner for performing the exposure of a wafer-inward region. The photolithographic processing system forms a Litho-Cluster which typically has a lithographic processing track including an aligner part such as a scanner, and a coater. In general, a peripheral exposure unit for performing the peripheral exposure is provided in the lithographic processing track.

Further Detailed Description of the Embodiments

The embodiments of the invention will be described further in detail. The same or like parts in the drawings are identified by the same or similar symbol or reference numeral, and the iteration of the description thereof is avoided in principle.

In the accompanying drawings, if hatching makes the representation more complicated or if it is possible to clearly distinguish a part or member from a gap, the hatching or the like is possibly omitted even with a cross section. Likewise, with respect to even a closed hole in plane view, if it is clearly identified from the description or the like, the drawing of its background border line is possibly omitted. Further, even if a part or member of interest is not presented in sectional view, the hatching is possibly made for clearly showing that it is not a gap.

In the case of referring to the parts or members to be alternatively termed with the one accompanied with "first" and the other with "second", such parts or members are associated with the terms accompanied with the words "first" and "second" according to the representative embodiment, and exemplified in some cases. However, it is obvious that what is referred to by e.g. a term accompanied by the word "first" is not limited to the exemplified option.

The prior patent applications which have disclosed the SOI process include e.g. Japanese Patent Application number 2011-223666, filed on Oct. 11, 2011 in Japan.

1. Description of Important Parts of the Wafer Process in the Method for Manufacturing a Semiconductor Integrated Circuit Device According to One Embodiment Hereof (BOX & SOI Layers-Removing Preceding Process) and Others (See FIGS. 1 to 7, Chiefly).

This section describes an embodiment of the wafer process between the loading of a wafer and the provisional completion of a gate structure. While in the description below, an SOC chip is taken as an example of the device in connection with the present invention, and is explained concretely, it is needless to say that the envisioned device may be a chip for exclusive memory use. With the embodiment below, the concrete description is presented taking a product of 28-nm- technology node generation as an example chiefly. However, it is obvious that the description below is applicable to other generations.

Figure 18:
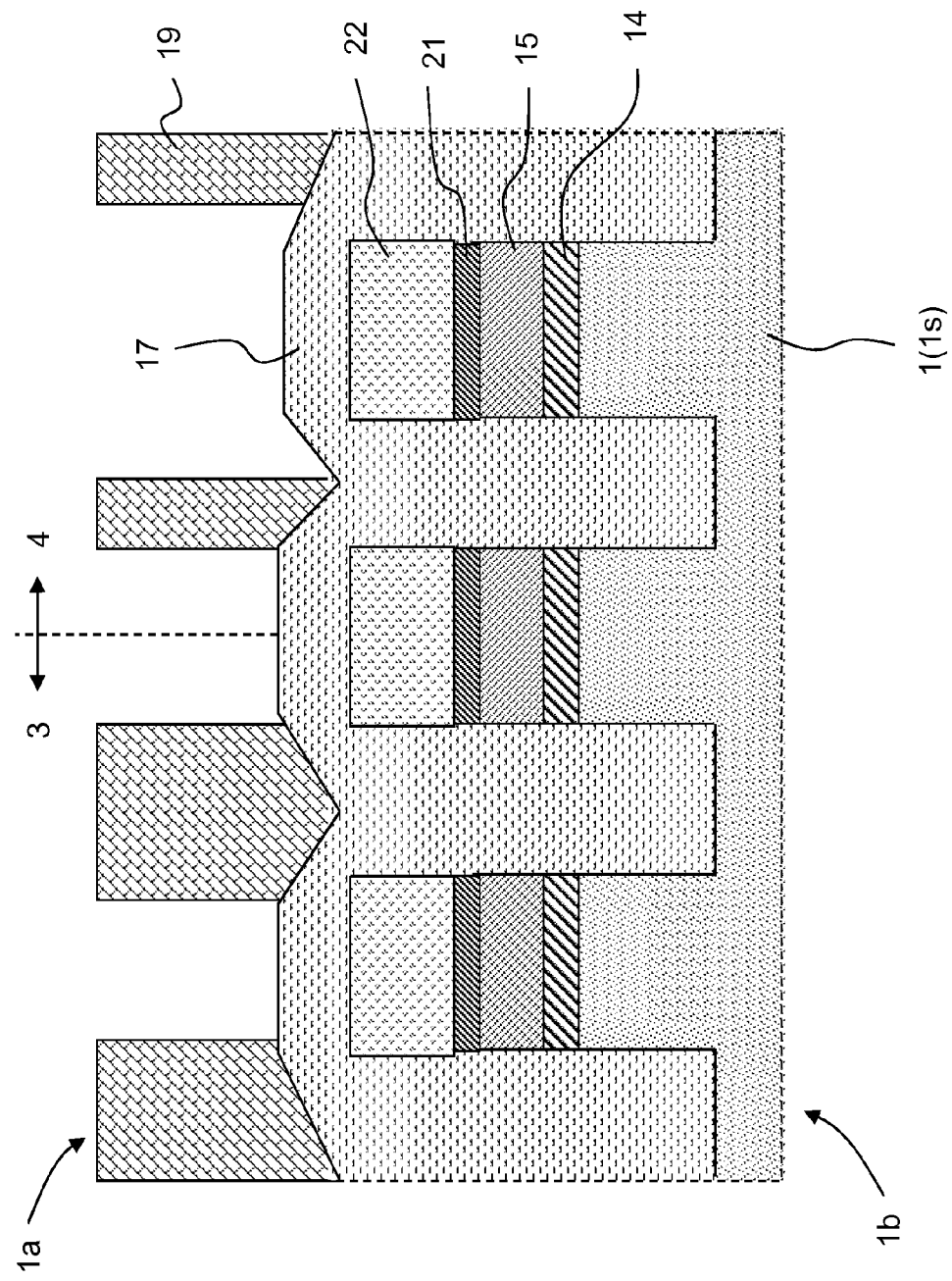
FIG. 18 is a sectional view of the wafer-inward region for explaining an important part (the step of forming a resist pattern for reverse oxide film etching) of the wafer process in the method for manufacturing a semiconductor integrated circuit device (STI preceding process) according to the embodiment.
Figure 19:
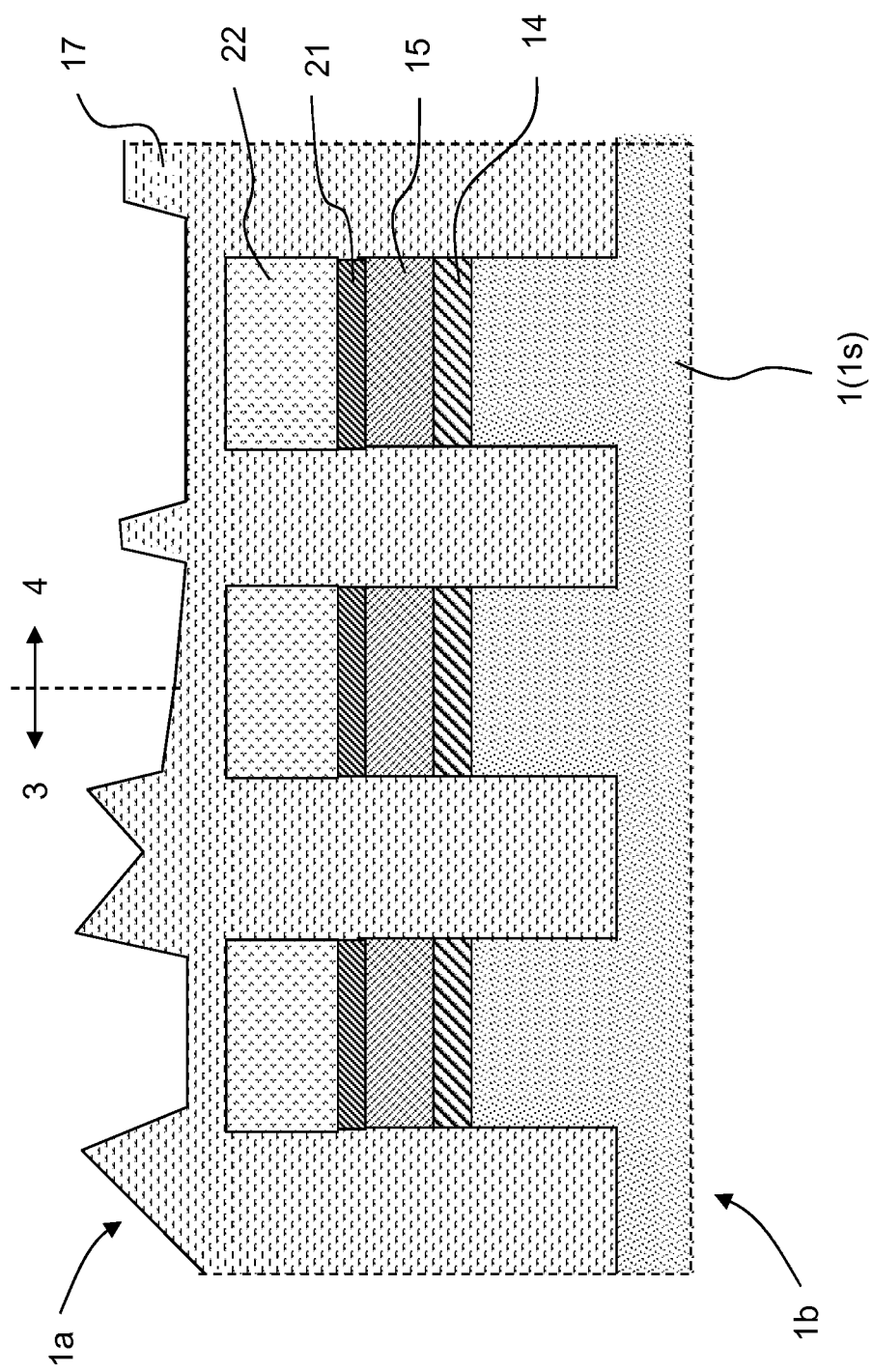
FIG. 19 is a sectional view of the wafer-inward region for explaining an important part of the wafer process (the step of reverse oxide film etching) in the method for manufacturing a semiconductor integrated circuit device (STI preceding process) according to the embodiment.

Now, it is noted that the reverse oxide film etching in the STI process is to be described in the fifth section in detail with reference to FIGS. 18 and 19, and therefore the description thereof will be omitted here in principle.

It is needless to say that the wafer peripheral processing (i.e. removal of a BOX layer, an SOI layer and the like in the wafer peripheral portion) as a countermeasure against exfoliation, which will be described in this section, is not essential. However, the troubles including exfoliation in a wafer peripheral portion can be reduced by performing the processing.

Further, in the embodiment below, a typical FD-SOI (Fully Depleted Silicon on Insulator) device will be taken as an example, and described specifically. However, it is obvious that the device may be a so-called dopantless channel type FD-SOI device.

It is noted that while the integrated circuit described here takes a CMOS circuit structure chiefly in the SOI device region 3 and the bulk device region 4, only a portion of an N-channel type device is shown to avoid complexity in the drawing in principle.

Figure 2:
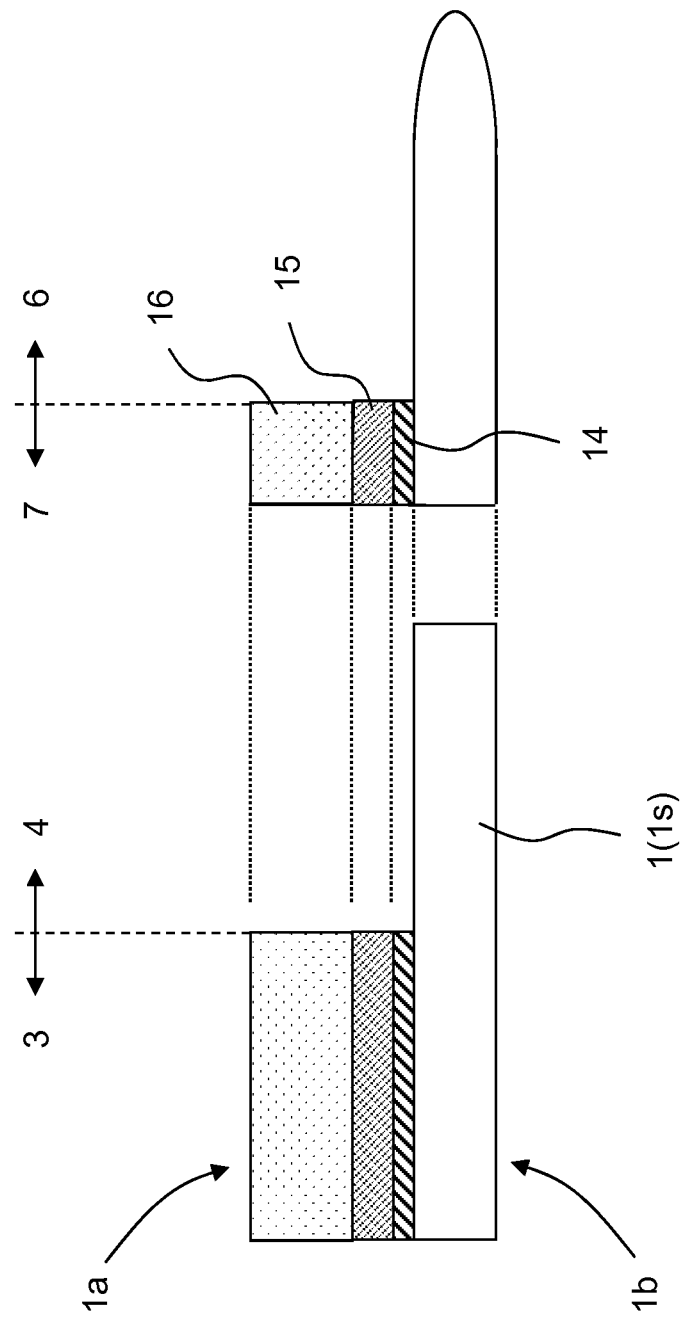
FIG. 2 is a sectional view for explaining an important part of the wafer process in the method for manufacturing a semiconductor integrated circuit device according to the embodiment (BOX & SOI layers-removing preceding process), showing wafer-inward and -peripheral regions (the step of removing BOX & SOI layers of a bulk device region and the like)
Figure 3:
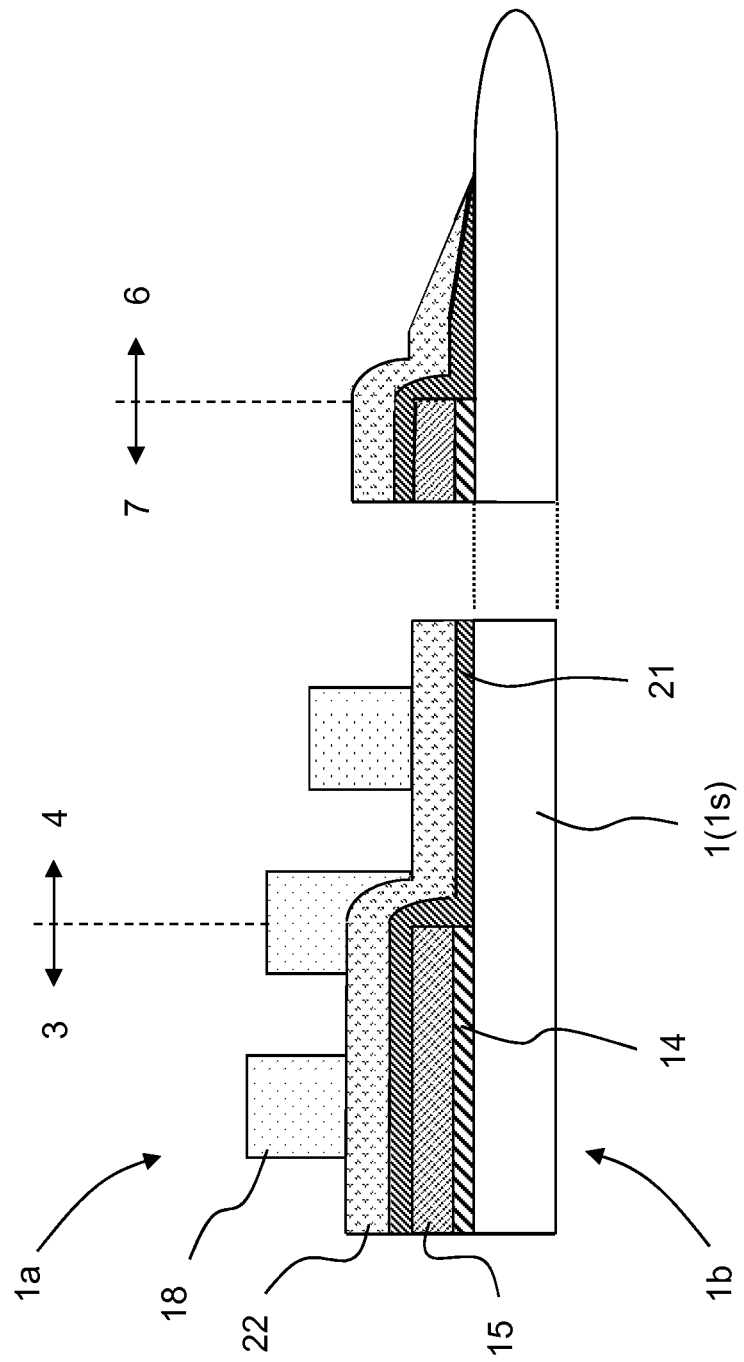
FIG. 3 is a sectional view for explaining an important part of the wafer process in the method for manufacturing a semiconductor integrated circuit device according to the embodiment (BOX & SOI layers-removing preceding process), showing wafer-inward and -peripheral regions (Step for forming a resist pattern for trench formation)
Figure 4:
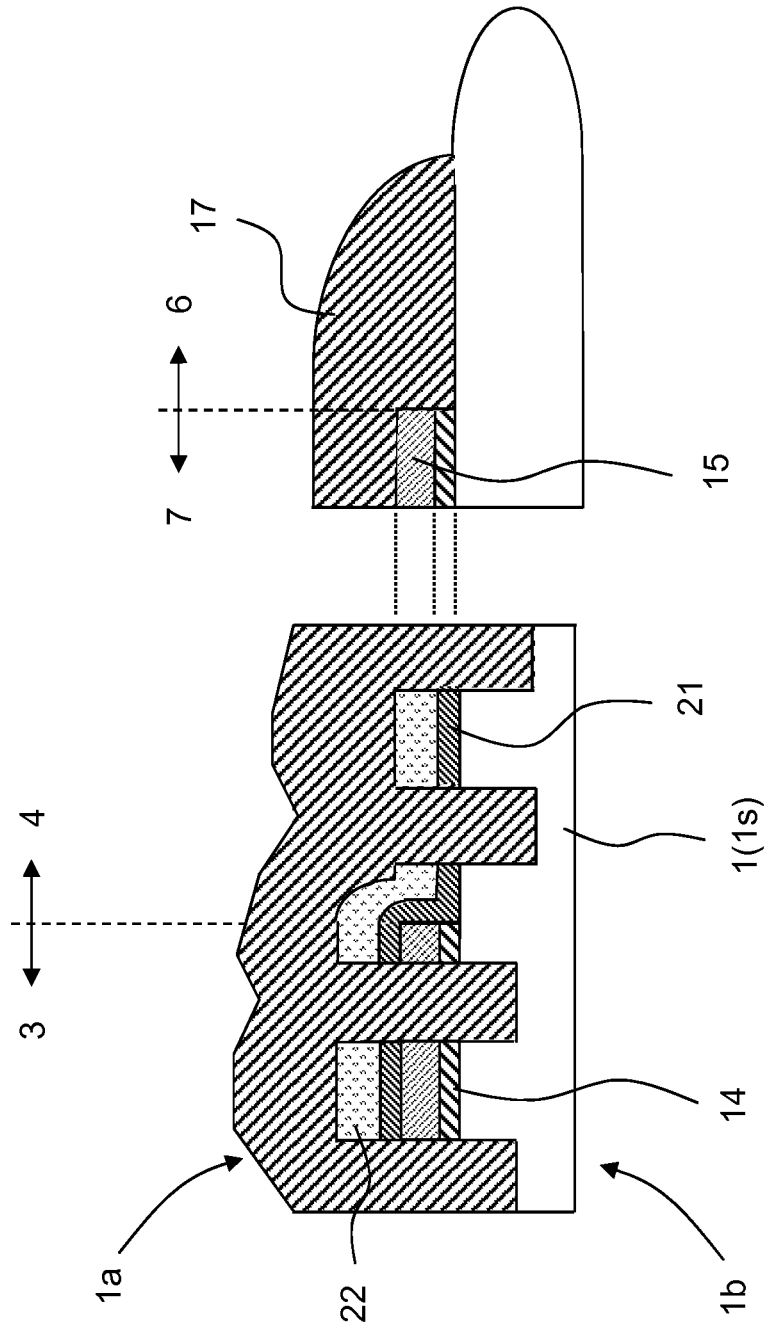
FIG. 4 is a sectional view for explaining an important part of the wafer process in the method for manufacturing a semiconductor integrated circuit device according to the embodiment (BOX & SOI layers-removing preceding process), showing wafer-inward and -peripheral regions (Step for burying an STI insulative film)
Figure 5:
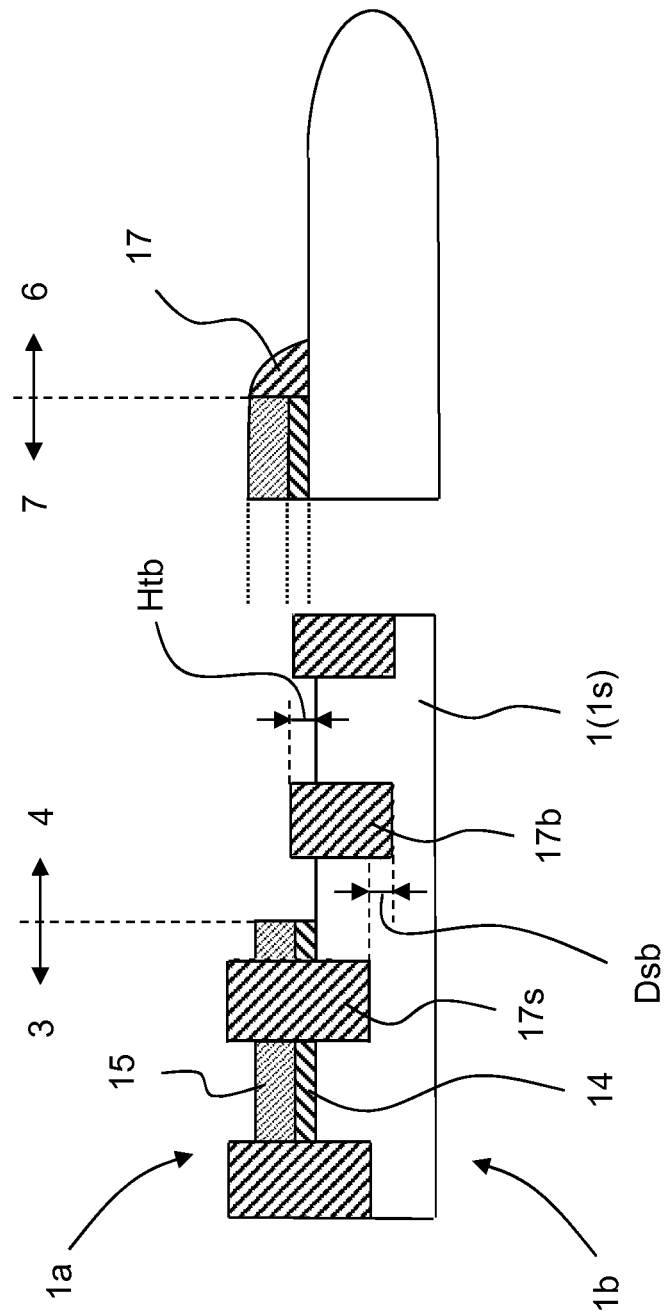
FIG. 5 is a sectional view for explaining an important part of the wafer process in the method for manufacturing a semiconductor integrated circuit device according to the embodiment (BOX & SOI layers-removing preceding process), showing wafer-inward and -peripheral regions (Step for STI-CMP and removal of a silicon nitride film and others)
Figure 6:
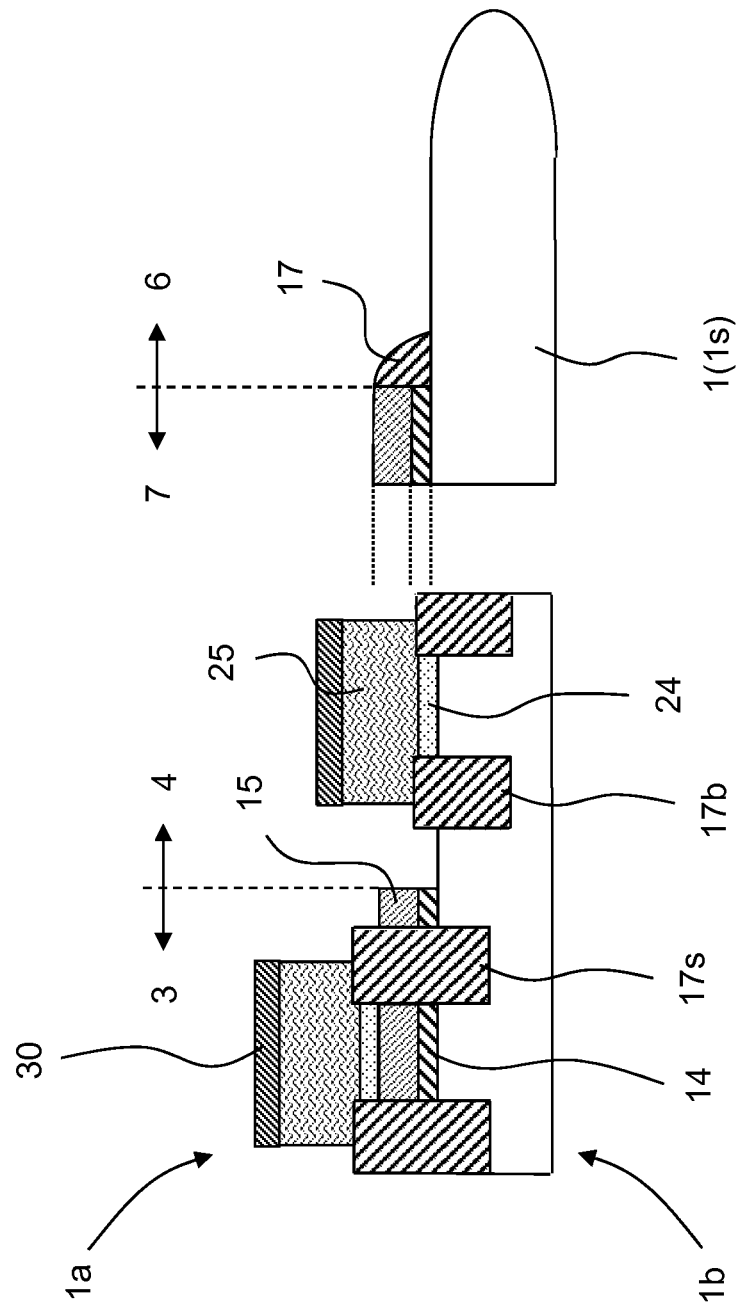
FIG. 6 is a sectional view for explaining an important part of the wafer process in the method for manufacturing a semiconductor integrated circuit device according to the embodiment (BOX & SOI layers-removing preceding process), showing wafer-inward and -peripheral regions (gate electrode-processing step)
Figure 7:
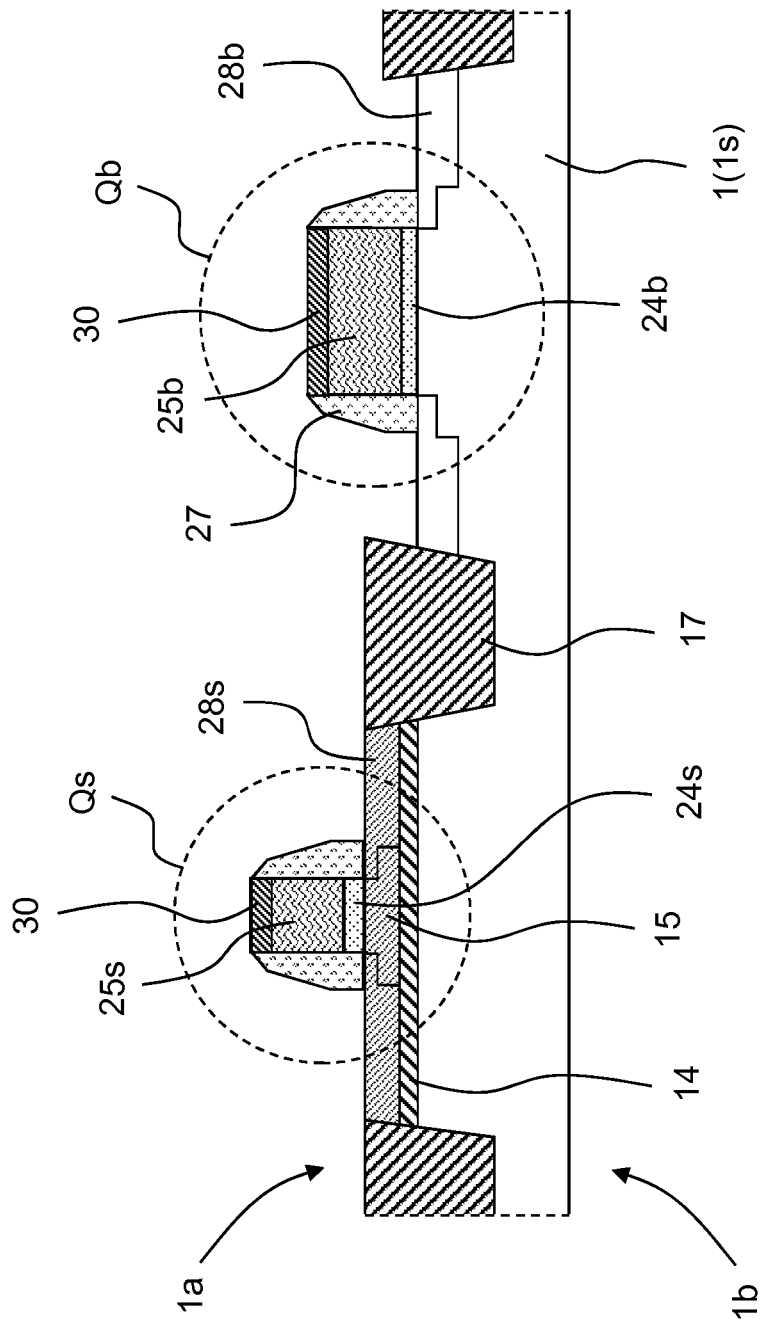
FIG. 7 is a sectional view of the wafer-inward region (at the time of the completion of a gate electrode) for explaining an important part of the wafer process in the method for manufacturing a semiconductor integrated circuit device according to the embodiment (BOX & SOI layers-removing preceding process), which is taken along a different direction (i.e. the channel length direction) from the direction (i.e. the channel width direction) that FIG. 6 and other drawings are taken along.

FIG. 1 is a sectional view for explaining an important part of the wafer process in a method for manufacturing a semiconductor integrated circuit device according to one embodiment hereof (BOX & SOI layers-removing preceding process), showing wafer-inward and -peripheral regions (the step of SOI wafer introduction). FIG. 2 is a sectional view for explaining an important part of the wafer process in the method for manufacturing a semiconductor integrated circuit device according to one embodiment hereof (BOX & SOI layers-removing preceding process), showing wafer-inward and -peripheral regions (Step for removing BOX & SOI layers of a bulk device region and the like). FIG. 3 is a sectional view for explaining an important part of the wafer process in the method for manufacturing a semiconductor integrated circuit device according to one embodiment hereof (BOX & SOI layers-removing preceding process), showing wafer-inward and -peripheral regions (the step of processing a resist film for trench formation), FIG. 4 is a sectional view for explaining an important part of the wafer process in the method for manufacturing a semiconductor integrated circuit device according to one embodiment hereof (BOX & SOI layers-removing preceding process), showing wafer-inward and -peripheral regions (Step for burying an STI insulative film). FIG. 5 is a sectional view for explaining an important part of the wafer process in the method for manufacturing a semiconductor integrated circuit device according to one embodiment hereof (BOX & SOI layers-removing preceding process), showing wafer-inward and -peripheral regions (the step of STI-CMP and removal of a silicon nitride film and others), FIG. 6 is a sectional view for explaining an important part of the wafer process in the method for manufacturing a semiconductor integrated circuit device according to one embodiment hereof (BOX & SOI layers-removing preceding process), showing wafer-inward and -peripheral regions (the step of gate electrode processing). FIG. 7 is a sectional view of the wafer-inward region (at the time of the completion of a gate electrode) for explaining an important part of the wafer process in the method for manufacturing a semiconductor integrated circuit device according to one embodiment hereof (BOX & SOI layers-removing preceding process), which is taken along a different direction (i.e. the channel length direction) from the direction (i.e. the channel width direction) that FIG. 6 and other drawings are taken along. With reference to the drawings, an important part of the wafer process and other things in the method for manufacturing a semiconductor integrated circuit device according to one embodiment hereof (BOX & SOI layers-removing preceding process) will be described.

First, a P-type SOI semiconductor wafer 1 is prepared, which has a BOX oxide film 14 (BOX layer) having a thickness of about 10 nm (preferably from approximately several to 20 nm), and an SOI layer 15 having a thickness of about 26 nm (preferably from approximately several to 30 nm), as shown in FIG. 1. Specifically, a P-type monocrystalline silicon wafer (with a P-type substrate part 1s) is prepared, which has an SOI layer 15 and a BOX oxide film 14 formed almost all over the surface on the side of the device-mount face 1a (i.e. a principal face opposite to the backside 1b). It is assumed here that the wafer 1 has a diameter of e.g. 300$^\Phi$, however it may be 450$^\Phi$, 200$^\Phi$, or another size if required. It is preferable that the P-type substrate part 1s and the SOI layer 15 have an electrical resistivity of e.g. 1 to 10 Ωcm approximately. The orientation of the wafer 1 can be made e.g. (100), however another orientation may be arranged. Incidentally, in FIG. 1, the right-side region partitioned off by a broken line is the wafer-peripheral region 6, and the left-side region is the wafer-inward region 7.

Next, as shown in FIG. 2, a resist film 16 for bulk device region definition is formed almost all over the surface of the wafer 1 on the side of the face 1a thereof. The resist film 16 for bulk device region definition is patterned by e.g. a typical photolithography. Subsequently, the patterned resist film 16 for bulk device region definition is used as a mask to remove the SOI layer 15 in the bulk device region 4 and in the wafer-peripheral region 6 by e.g. dry etching, in which e.g. a halogen-based etching gas is used. Then, the BOX layer 14 is removed in the bulk device region 4 and in the wafer-peripheral region 6 by e.g. wet etching, in which e.g. a hydrofluoric acid-based etchant is used. After that, the disused resist film 16 for bulk device region definition is removed by e.g. ashing. The exposure of the resist film 16 for bulk device region definition in the wafer-peripheral region 6 will be described in detail in the sections 3 and 4, and therefore, the description thereof is omitted here. By removing the BOX layer 14 and SOI layer 15 in the peripheral portions of the wafer in this way, the generation of dust in the subsequent steps can be reduced.

Then, a pad silicon oxide film 21 having a thickness of about 10 nm is formed almost all over the surface of the wafer 1 on the side of the face 1a by e.g. CVD (Chemical Vapor Deposition), as shown in FIG. 3. Subsequently, a silicon nitride film 22 for a stopper of CMP (Chemical Mechanical Polishing) is formed by e.g. CVD almost all over the surface of the wafer 1 on the side of the front face 1a to have a thickness of e.g. about 60 nm. Then, a resist film 18 for trench formation is formed almost all over the surface of the wafer 1 on the side of the front face 1a; the resist film 18 for trench formation is patterned by e.g. a typical photolithography.

Subsequently, as shown in FIG. 4, a trench which will form an STI region is formed by e.g. anisotropic dry etching while using, as a mask, the patterned resist film 18 for trench formation. In this embodiment, the trench extends through the BOX layer 14 and reaches the inside of the substrate 1s in the SOI device region 3. By making the arrangement like this, the harmonization with the depth of the trench in the bulk device region 4 can be ensured. Also, the mutual isolation between back-gate regions in the SOI device region 3 can be enhanced.

Subsequently, a liner silicon oxide film is formed on a semiconductor surface exposed on the side of the front face 1a of the wafer 1 by e.g. thermal oxidation (which is not shown to avoid increasing the complexity of the drawing).

Subsequently, a silicon oxide film is formed as an STI insulative film 17 almost all over the surface of the wafer 1 on the side of the front face 1a by e.g. HDP (High Density Plasma)-CVD (the silicon oxide film may be formed according to another method).

Subsequently, the reverse oxide film etching is performed with the resist film for reverse oxide film etching as a preparation for CMP, as described in the fourth section. However, in this embodiment, the processing is performed according to the uniform reduction method unlike the case of the fourth section. While the method to apply to this processing may be the bulk-device-side-etching-amount-increasing method as in the case of the fourth section, the uniform reduction method has the advantage that the process is simpler. The application of the bulk-device-side-etching-amount-increasing method brings about the same advantage as the method applied in the case of the fourth section does.

Next, CMP is executed on the side of the front face 1a of the wafer 1, whereby the front face of the wafer is planarized. Then, silicon nitride film 22 is removed by e.g. wet etching, in which the etchant used therefor is e.g. a hot phosphoric acid. Subsequently, the pad silicon oxide film 21 is removed by e.g. wet etching, in which the etchant is e.g. a hydrofluoric acid-based etchant. As a result, the structure as shown in FIG. 5 is obtained. The STI insulative film 17 is buried in each trench as shown in FIG. 5; the STI regions 17, 17s and 7b, i.e. the first and second STI regions 17s and 17b are formed. In this case, as clear from FIG. 5, an STI height Htb (i.e. bulk device region STI height) in the bulk device region 4 is relatively low with respect to the front face of the semiconductor substrate 1s. This is useful to avoid that a step deteriorates the effect of the photolithography. There is an SOI-bulk inter-region SOI bottom step Dsb between the STI region 17b (second STI region) of the bulk device region, and the STI region 17s (first STI region) of the SOI device region. Therefore, the STI region 17b (i.e. second STI region) of the bulk device region is deeper in terms of the depth of the STI region (i.e. the height of the bottom face of the STI region) with respect to the surface of the semiconductor substrate 1s. This is advantageous to a bulk device which has a high operation voltage in general.

The steps can be simplified by arranging a process not to involve the step of forming an epitaxial semiconductor layer at least on the bulk device region 4 after the removal of the BOX layer 14 and the SOI layer 15 and before the formation of the STI region 17 as in this embodiment, which is optional.

Subsequently, as shown in FIG. 6, a SiON film serving as e.g. a gate insulating film 24 and having an EOT (Equivalent Oxide Thickness) of about 1.9 nm is formed almost all over the surface of the wafer 1 on the side of the front face 1a. Subsequently, a TiN film (having a thickness of e.g. 20 nm approximately) is formed almost all over the surface of the wafer 1 on the side of the front face 1a by sputtering, as a part of the gate electrode 25. Then, a polycrystalline silicon film (having a thickness of e.g. 80 nm approximately) is formed almost all over the surface of the wafer 1 on the side of the front face 1a by e.g. CVD, as a part of the gate electrode 25. It is noted that an amorphous silicon film may be formed instead of the polycrystalline silicon film. Next, a silicon nitride film (having a thickness of e.g. 50 nm approximately) is formed almost all over the surface of the wafer 1 on the side of the front face 1a by e.g. CVD, as a cap insulative film 30.

After that, the cap insulative film 30, the gate electrode 25 and the gate insulating film 24 (gate stack structure) are patterned by the typical photolithography.

Subsequently, N-type source and drain regions 28s of MIS-FET of the SOI device region, and N-type source and drain regions 28b of MISFET of the bulk device region, which are required, are formed by e.g. ion implantation while using a gate stack structure and side walls 27, as shown in FIG. 7. Incidentally, FIG. 7 presents a cross section of the wafer perpendicular to a cross section drawn in FIG. 6 so that a source, a drain and other parts can be seen. Basically, an N-type MISFET (Qs) which is a MISFET of the SOI device region, and an N-type MISFET (Qb) which is a MISFET of the bulk device region have been formed by the above steps. Now, it is noted that the SOI device region (e.g. a channel part) takes a P-type doped structure in this embodiment, however it may be arranged to have a non-doped structure.

After that, the wafer goes through e.g. the formation of a premetal insulative film and a contact hole, the burying of a tungsten plug, and BEOL phase including the step of making interconnections (which may be composed of e.g. multilayered copper-based buried lines, aluminum-based lines, or a wiring system with both types of lines used therein), and is divided into chips by dicing or the like. The chips are arranged into packages on an as-needed basis. Then, finished devices are obtained.

The BOX & SOI layers-removing preceding process has the advantage that in the case of using the reverse oxide film etching of the uniform reduction method (with a positive reduction rate), a sufficient alignment margin can be set for an active end portion in reverse oxide film etching.

2. Descriptions of the Layout of a Wafer and Parts Including a Chip Region, in the Method for Manufacturing a Semiconductor Integrated Circuit Device According to the Embodiment Hereof, and the Alignment Mark, etc. to be Formed in STI Step (with Reference to FIGS. 8 to 11, Chiefly)

An example of the layout of various parts on the wafer, the alignment mark, and others will be described here in connection with the wafer process described in the section 1. It goes without saying that various structures (the notch, and the alignment mark) described here are not essential, and various changes and modifications may be made as in the case of the above-described process.

Figure 8:
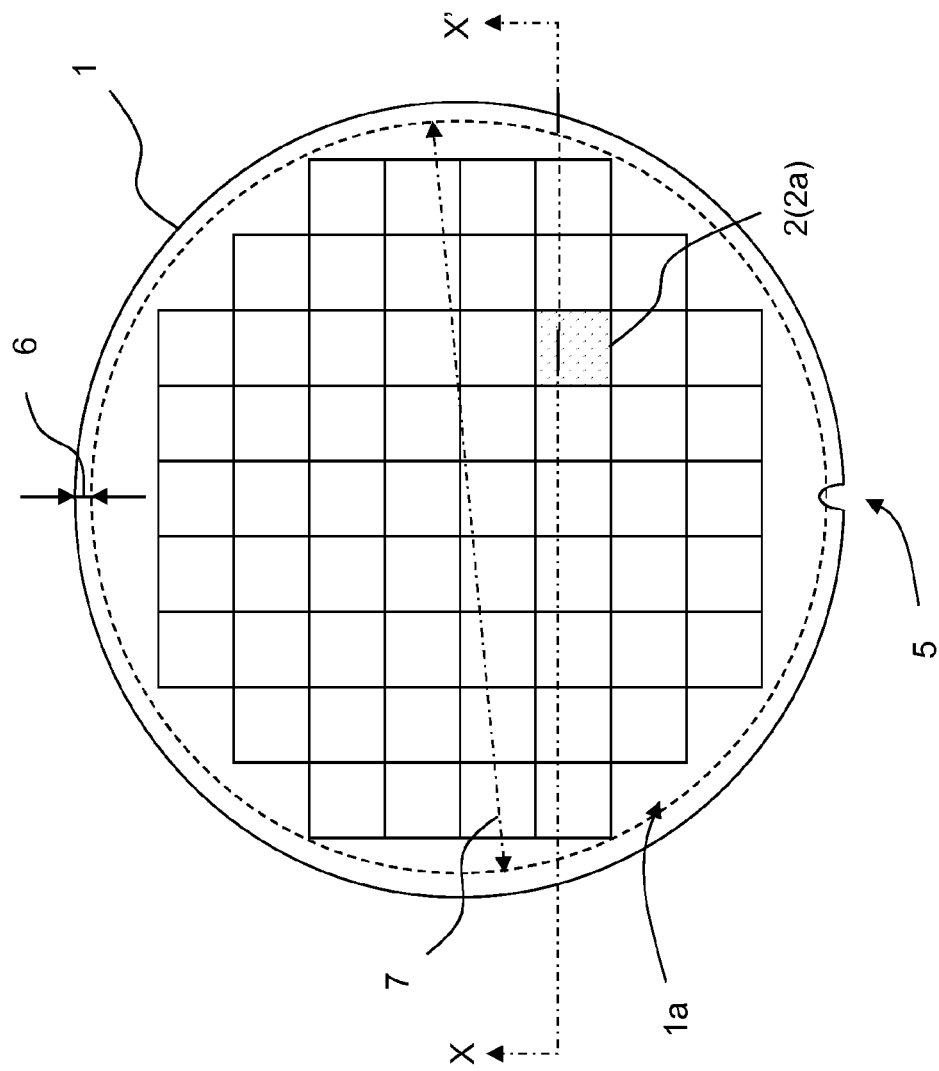
FIG. 8 is a view showing the layout of various regions on the front face of the semiconductor wafer shown in FIGS. 1 to 7.
Figure 9:
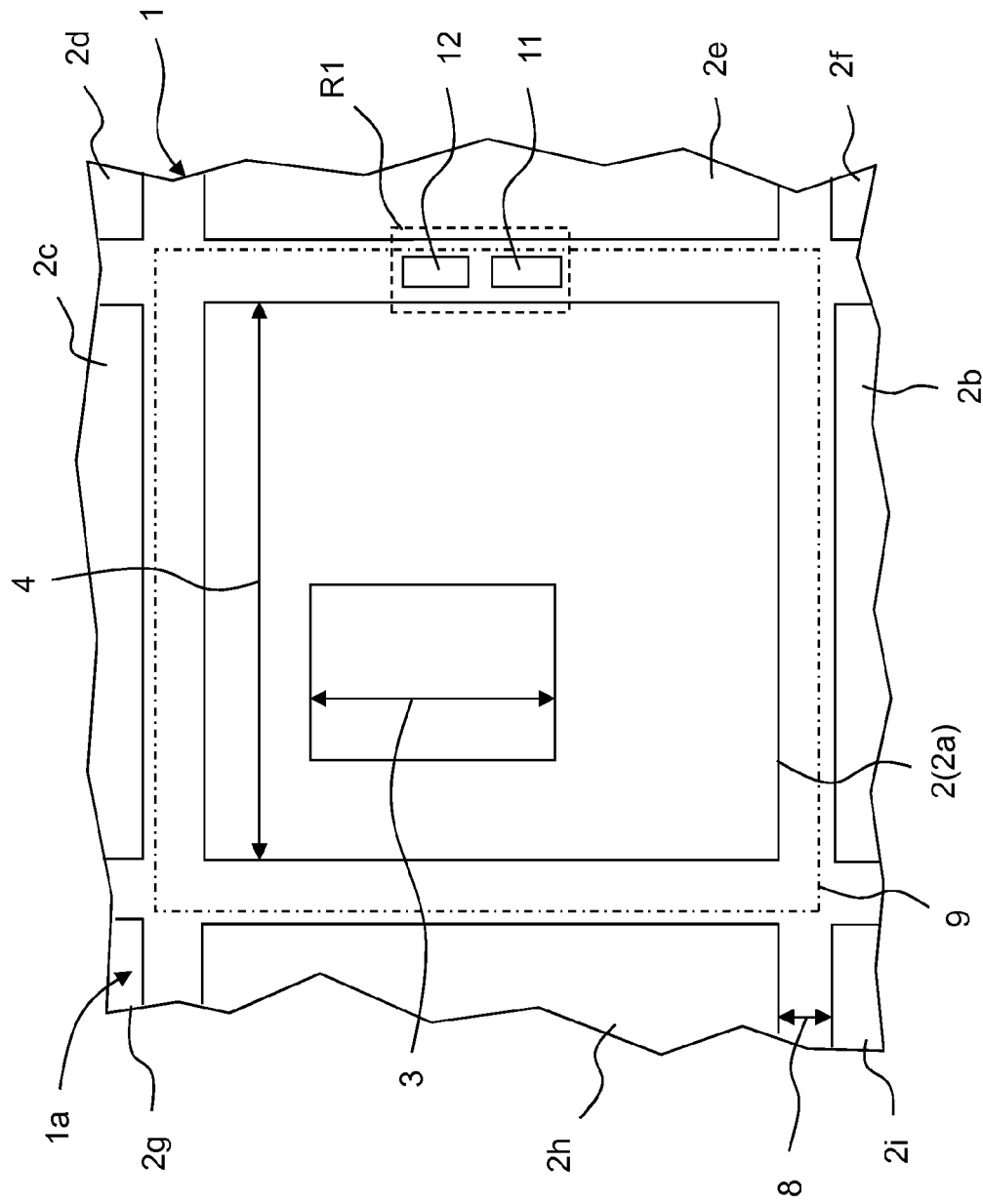
FIG. 9 is a view showing the layout of the chip region and its surrounding regions of FIG. 8.
Figure 10:
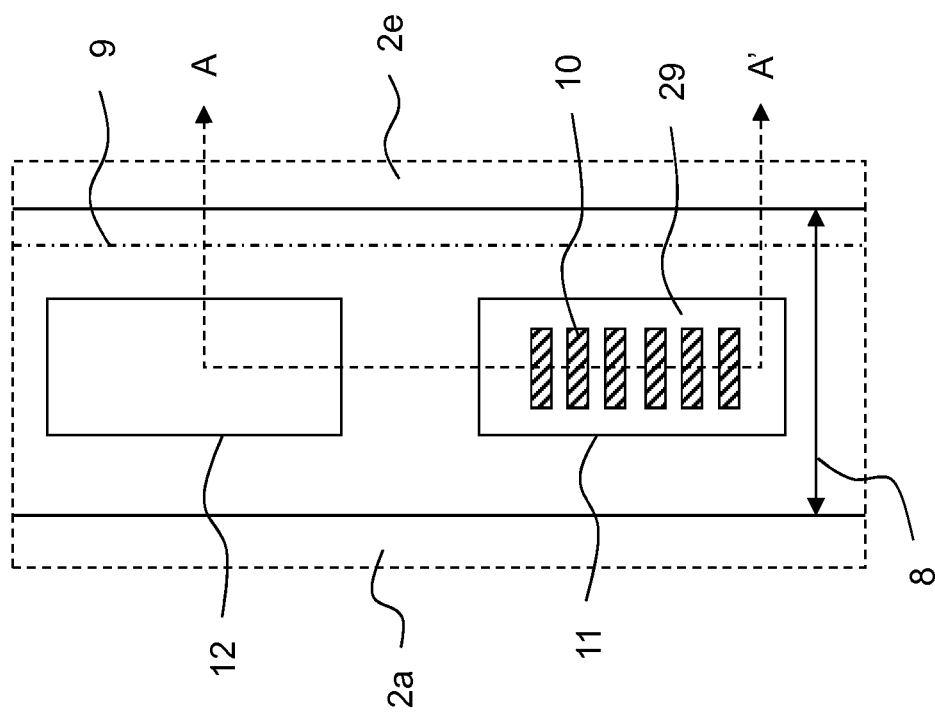
FIG. 10 is an enlarged top view of an alignment pattern surrounding cut-out region R1 of FIG. 9.
Figure 11:
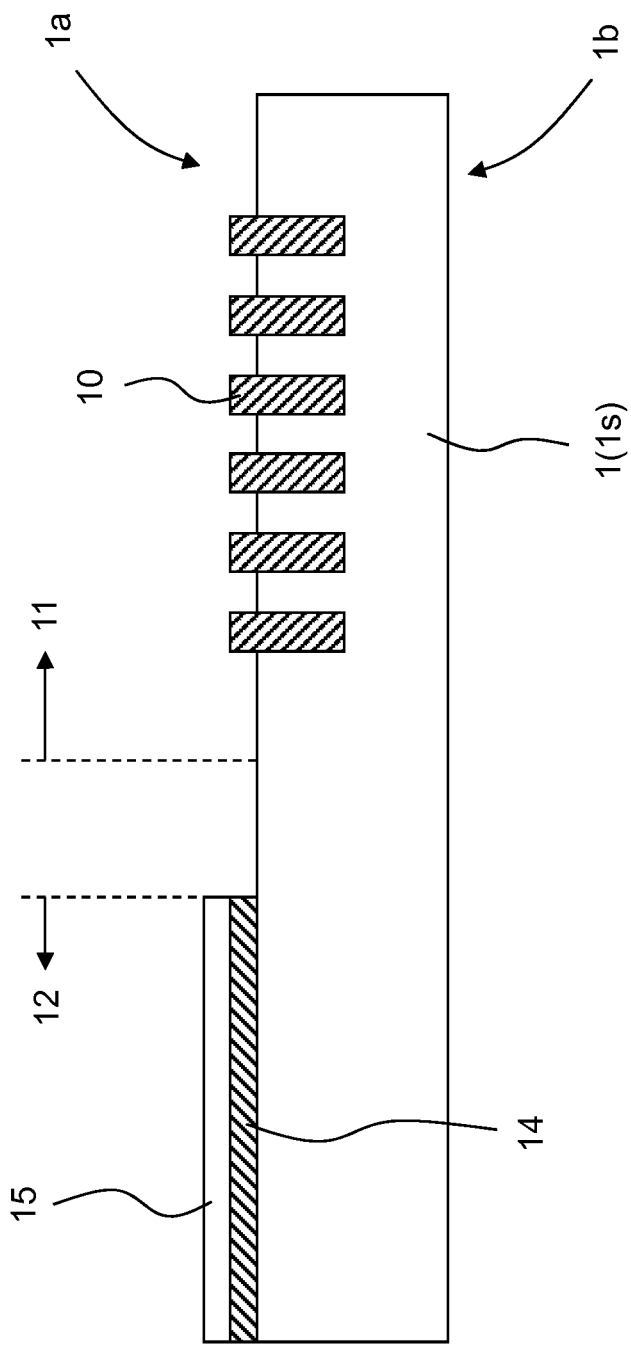
FIG. 11 is a sectional view of the wafer taken along the line A-A' of FIG. 10.

FIG. 8 is a view showing the layout of various regions on the front face of the semiconductor wafer shown in FIGS. 1 to 7. FIG. 9 is a view showing the layout of the chip region of FIG. 8 and the regions around it. FIG. 10 is an enlarged top view of an alignment pattern surrounding cut-out region R1 of FIG. 9. FIG. 11 is a wafer sectional view taken along the line A-A' of FIG. 10. The layout of a wafer and parts including a chip region, in the method for manufacturing a semiconductor integrated circuit device according to the embodiment hereof, and the alignment mark, etc. to be formed in STI step will be described with reference to the drawings.

FIG. 8 shows an example of the layout of various regions in the front face 1a (first principal face) of the wafer 1 in the course of the wafer process of the semiconductor integrated circuit device (at the same time as FIG. 5). As shown in FIG. 8, the wafer 1 has a notch 5 (crystal orientation indicator part) or the like in general. The front face 1a thereof is divided into e.g. a wafer-peripheral region 6 and a wafer-inward region 7. In the wafer-inward region 7, lots of chip regions 2 and 2a are laid out substantially in a matrix-like form. Incidentally, the cross sections shown in FIGS. 1 to 6 substantially correspond to the cross section taken along the line X-X' of FIG. 8.

FIG. 9 presents the chip region 2a and its surroundings of FIG. 8 in an enlarged form. As shown in FIG. 9, the chip regions 2a, 2b, 2c, 2d, 2e, 2f, 2g, 2h, and 2i are arranged in a lattice-like form to sandwich a scribing region 8 (dicing region) therebetween in this embodiment, for example. In each chip region 2a (, 2b, 2c, 2d, 2e, 2f, 2g, 2h, 2i), the SOI device region 3 and the bulk device region 4 are provided. The SOI device region 3 corresponds to a core logic circuit part, or a memory mat part, for example, in terms of the circuit. The bulk device region 4 corresponds to a core logic peripheral circuit part, an I/O circuit part, a memory peripheral circuit part, or the like.

An alignment mark formation region 11, and a test pattern region 12 having a BOX layer and an SOI layer, where TEG (Test Element Group) or the like is disposed, are provided in the dicing region 8 between the chip region 2a and the chip region 2e, for example. In this embodiment, an exposure unit shot region 9 includes one chip region 2a, and therefore it includes almost all the chip region 2a and its surrounding dicing region 8.

Next, an enlarged view of the alignment pattern surrounding cut-out region R1 shown in FIG. 9 is presented in FIG. 10. As shown in FIG. 10, an alignment mark 10 composed of e.g. lots of rectangles is provided in the alignment mark formation region 11. The alignment mark 10 is an example of a mark formed in an STI region forming process, and is mainly made of an STI insulative film 17. Specifically, the alignment mark 10 is made of an insulative film formed concurrently with STI insulative film buried in a trench formed in the step of trench formation included in the STI step. In addition, the BOX layer 14 and the SOI layer 15 are removed in the alignment mark formation region 11 in parallel with the step as shown with reference to FIG. 2. The reason for this is the BOX layer 14 and the SOI layer 15 cause an interference fringe such as a moire fringe, which can interfere with the detection of a position. In other words, the alignment mark formation region 11 makes a region similar to the bulk device region. Therefore, other regions in the alignment mark formation region 11 as well as the alignment mark 10 make an active region or a semiconductor substrate-exposed region 29. If there is not a region similar to the SOI device region in the vicinity of the alignment mark 10 like this, the increase in the accuracy of positioning is obtained.

On the other hand, the test pattern region 12 to hold the TEG or the like usually has a part which makes a region similar to the SOI device region; the similar region has the BOX layer 14 and the SOI layer 15. From the viewpoint of reducing dust and the like, it is not desired that the region similar to the SOI device region and the region similar to the bulk device region are finely divided and laid out in the part of the dicing region 8 other than the test pattern region 12 and the alignment mark formation region 11. However, it is not essential.

FIG. 11 shows a cross section taken along the line A-A' of FIG. 10. As shown in FIG. 11, the alignment mark formation region 11 has the same cross section structure as that of the bulk device region 4 shown in FIG. 5 at the time when the wafer is in the situation shown in FIG. 5.

Next, these regions and others will be described in association with the wafer process (particularly the exposure process) described in the section 1. Specifically, the alignment mark 10 as shown in FIG. 10 is formed in parallel with the steps as described with reference to FIGS. 3 to 5. The alignment mark 10 is to be used for e.g. the alignment in processing the gate electrode as described with reference to FIG. 6.

3. Detailed Description of the Peripheral Processing (i.e. Wafer Peripheral Exposure Processing) in the Method for Manufacturing a Semiconductor Integrated Circuit Device According to One Embodiment Hereof—Description of the Primary Aligner Outside Periphery Exposing Method (with Reference to FIGS. 12 and 27, Mainly.)

One example of the specific method (particularly a photolithography technique associated with FIG. 2) for the removal of the BOX layer 14 and the SOI layer 15 in the wafer-peripheral region 6, which has been described in the section 1 (with reference to FIG. 2), will be described in this section. It goes without saying that the method described here is not essential, and various changes and modification thereof may be made as in the case of the above-described process.

Figure 12:
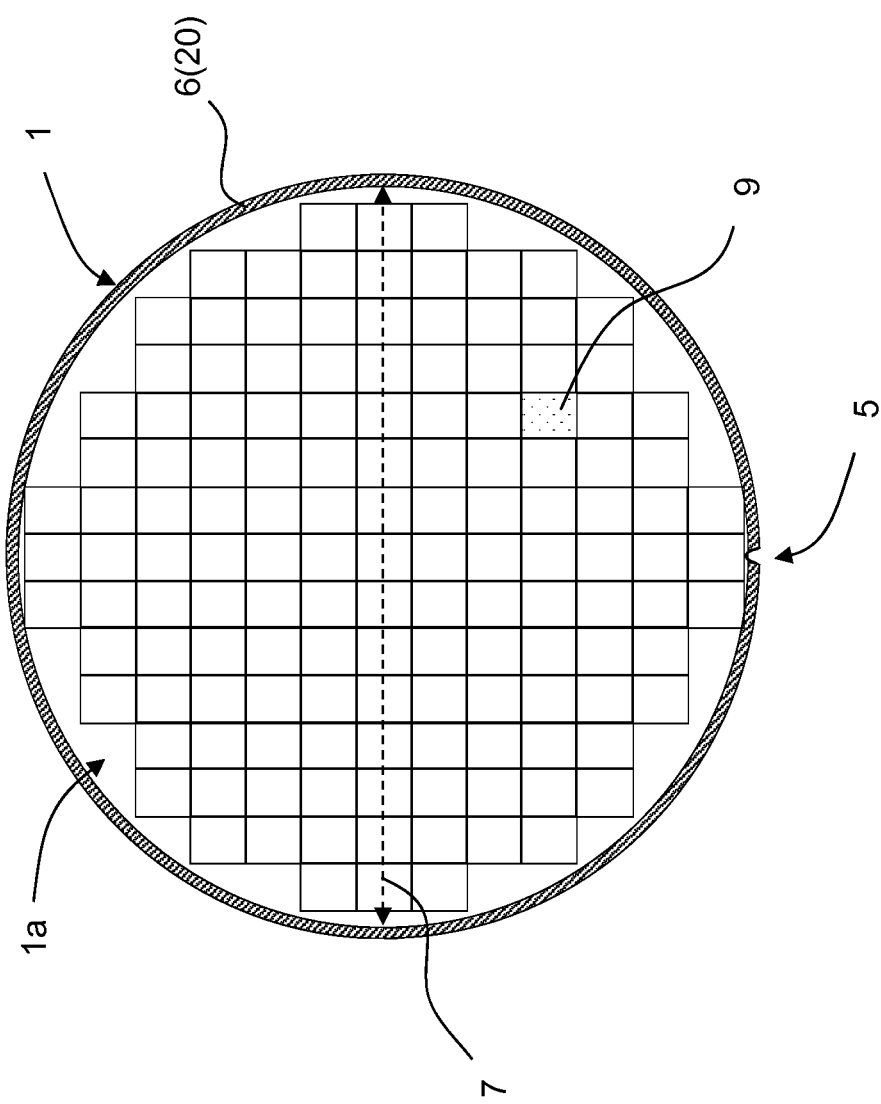
FIG. 12 is a top view of the whole wafer for explaining the detail of the wafer peripheral processing (the primary aligner outside periphery exposing method) in the method for manufacturing a semiconductor integrated circuit device according to the embodiment.
Figure 27:
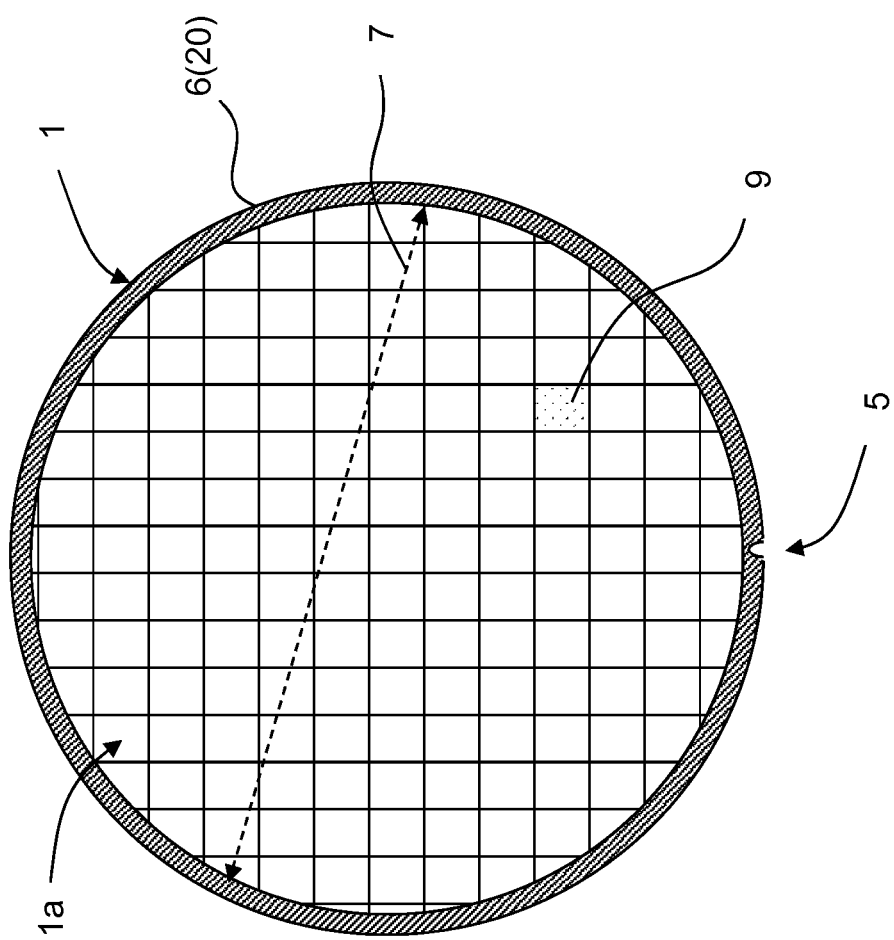
FIG. 27 is a top view of the whole wafer for explaining the detail of the wafer peripheral processing in a modification of the exposure method described with reference to FIG. 12.

FIG. 12 is a top view of the whole wafer for explaining the detail of the peripheral processing (the primary aligner outside periphery exposing method) in the method for manufacturing a semiconductor integrated circuit device according to one embodiment hereof. FIG. 27 is a top view of the whole wafer for explaining the detail of the wafer peripheral processing in a modification of the exposure method to be described with reference to FIG. 12. The detail of the peripheral processing (the primary aligner outside periphery exposing method) in the method for manufacturing a semiconductor integrated circuit device according to one embodiment hereof will be described with reference to the drawings.

In FIG. 12, the regions on the wafer 1 shown in FIG. 8 are classified for the sake of explanation of the exposure, provided that the point of processing the wafer put in the condition shown in FIG. 12 is the same as the time when the wafer is in the condition shown in FIG. 2. As shown in FIG. 12, unit shot regions 9 are set substantially in a matrix-like form in the wafer-inward region 7 in the front face 1a of the wafer 1. In this embodiment, the wafer-peripheral region 6 corresponds to a peripheral exposure region 20, namely a region to go through the peripheral exposure.

The photolithography of FIG. 2 is executed according to the following procedure which includes, in turn:

(1) the step of forming a resist film (e.g. application of a positive resist film);

(2) the peripheral exposure step (wherein the peripheral exposure region 20 is exposed to light while using a spot beam of ultraviolet light having the same wavelength as that of light used for regular exposure);

(3) regular exposure step (wherein a scanner, a stepper, or the like is used to perform the exposure for defining the bulk device region 4, etc. described with reference to FIG. 2 while using ultraviolet light of i-line having a wavelength of 365 nm);

(4) executing PEB (Post Exposure Bake); and (5) executing the development, post bake, etc.

This method has the advantage that the aligner's throughput is never reduced because no aligner is used. Incidentally, the wavelength used in the regular exposure step may be another wavelength other than the aforementioned one. In addition, as long as the resist film is exposed to light, the wavelength of the peripheral exposure step is not necessarily required to be the same as that of the regular exposure step. Further, a chemically amplified resist may be used as the resist film. Incidentally, a chemically amplified resist is said to be suitable for today's microfabrication in general. In addition, the resist film is not necessarily of positive type. In the case of a negative type resist used for the resist film, no resist film is formed on a wafer peripheral portion even when the peripheral exposure is not performed. Incidentally, as shown in FIG. 27, in the case of using an aligner to cause the exposure of a unit shot on the wafer peripheral portion (e.g. for the purpose of ensuring the uniformity of a pattern for CMP), a resist film can be prevented from being formed on the wafer peripheral portion after development by rinsing an edge in the resist processing. Further, in the case of a positive resist, the peripheral exposure as described above is applicable.

Further, the peripheral exposure step is executed before the regular exposure step in this embodiment. The reason for this is to minimize the processing time between the regular exposure and the PEB. However, this is not essential, and therefore it is obvious that the order of execution of the steps can be counterchanged with each other.

The primary aligner outside periphery exposing method is advantageous in that the throughput of the primary aligner (i.e. the primary aligner) is not reduced.

4. Description of Modification of the Peripheral Processing in the Method for Manufacturing a Semiconductor Integrated Circuit Device According to One Embodiment Hereof—Description of the Primary Aligner Inside Exposing Method in which a Mask is Used (with Reference to FIG. 13, Mainly)

In this section, a modification of the wafer peripheral exposure processing explained in the section 3 will be described.

Figure 13:
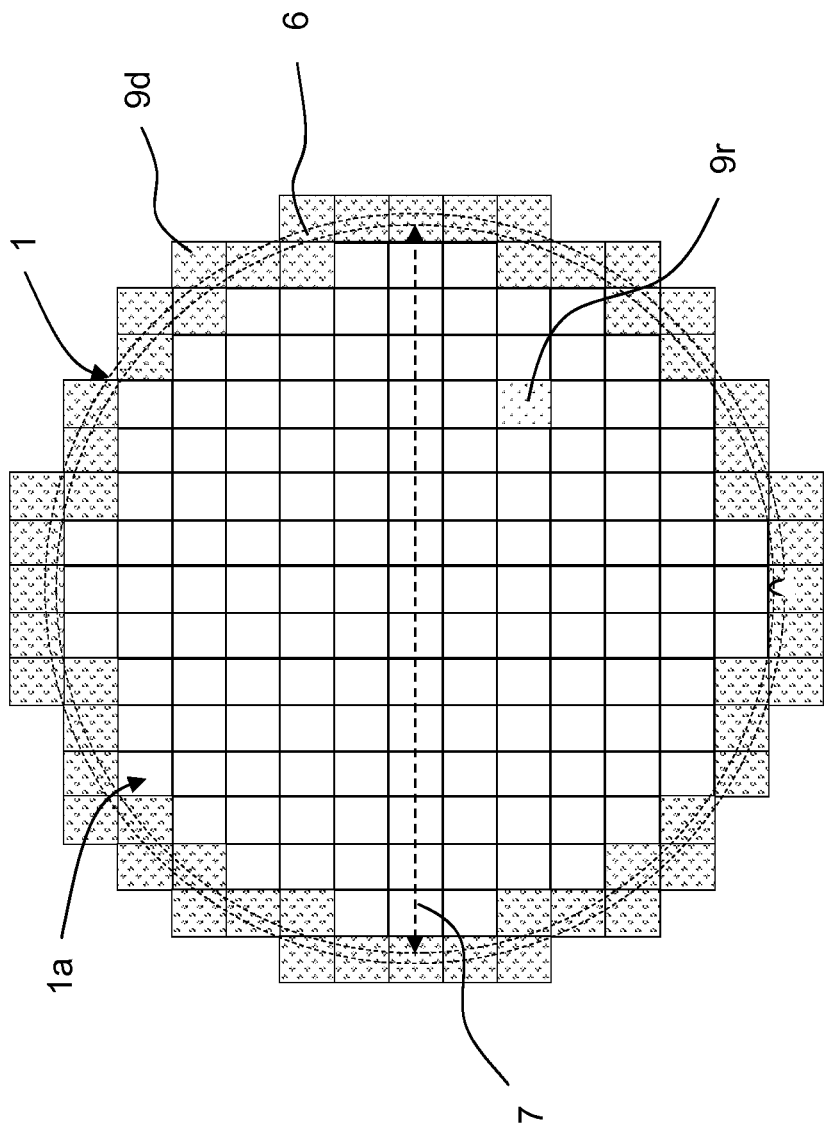
FIG. 13 is a top view showing the wafer and its surrounding portions for explaining a modification (the primary aligner inside exposing method in which a mask is used) of the peripheral processing in the method for manufacturing a semiconductor integrated circuit device according to the embodiment.

FIG. 13 is a top view showing the wafer and its surrounding portions for explaining a modification (the primary aligner inside exposing method in which a mask is used) of the peripheral processing in the method for manufacturing a semiconductor integrated circuit device according to one embodiment hereof. With reference to the drawing, the modification of the peripheral processing in the method for manufacturing a semiconductor integrated circuit device according to one embodiment hereof, namely the primary aligner inside exposing method in which a mask is used will be described.

FIG. 13 to which reference is made in this embodiment corresponds to FIG. 12. As shown in FIG. 13, the wafer peripheral exposure processing is executed in the regular exposure step (in the primary aligner) in this embodiment. Therefore, the flow of the processing is as follows, in turn:

(1) the step of forming a resist film (e.g. application of a positive resist film);

(2) wafer peripheral exposure & regular exposure step (wherein a scanner, stepper, or the like is used to perform the exposure for defining the bulk device region 4, etc. described with reference to FIG. 2 and to perform the wafer peripheral exposure processing while using e.g. ultraviolet light of i-line having a wavelength of 365 nm);

(3) Executing PEB (Post Exposure Bake); and (4) Executing the development, post bake, etc.

Specifically, a mask for peripheral exposure with a unit shot region 9 generally opening is previously prepared in addition to the mask (reticle), for example. The wafer peripheral exposure and the regular exposure are executed as a series of processing in such a way that the mask is replaced with the prepared one during the regular exposure. Now, it is noted that as shown in FIG. 13, what is targeted for the regular exposure is an actual unit shot region 9r, and what is targeted for the wafer peripheral exposure processing is a dummy unit shot region 9d. The wafer-peripheral region 6 described with reference to FIG. 12 is usually included in a set including all the dummy unit shot regions 9d.

The primary aligner inside exposing method in which the masks are used has the advantage that almost all of the peripheral portions of the wafer 1 make regions similar to the bulk device region while the throughput of the regular exposure is somewhat reduced (e.g. dust is reduced).

In the embodiment described here, the mask for peripheral exposure is formed on a mask substrate different from that of the mask for regular exposure. However, the masks may be formed in different parts of the same substrate. In the case of forming the masks in the same substrate, the time required for the replacement of the mask is shortened. In the case of the masks formed in different substrates, the shot area of the regular exposure can be made larger sufficiently.

5. Description of an Important Part of the Wafer Process in the Method for Manufacturing a Semiconductor Integrated Circuit Device According to Another Embodiment Hereof (in STI Preceding Process) (with Reference to FIGS. 14 to 22, Mainly)

In this section, a modification of the wafer process described in the section 1 will be described. The description below covers the modification, parts of which make the detailed description of the wafer process presented in the section 1, and the description concerning a modification of the reverse oxide film etching.

Figure 14:
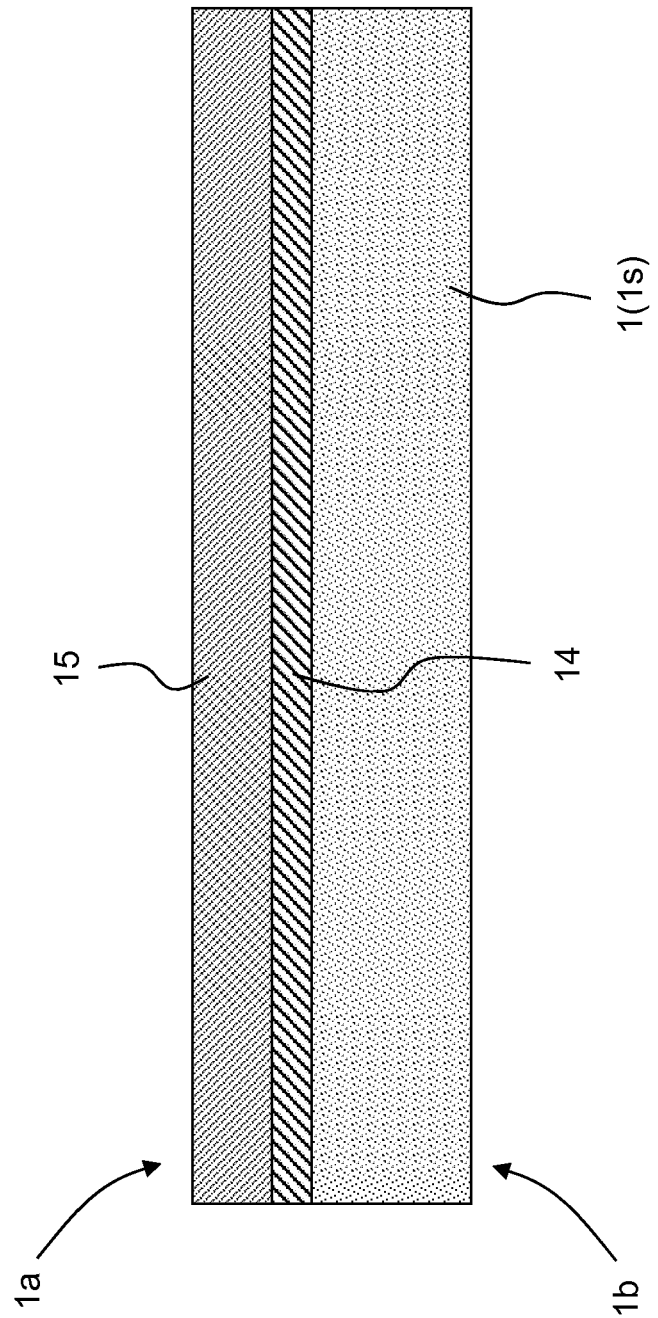
FIG. 14 is a sectional view of the wafer-inward region for explaining an important part (the step of SOI wafer introduction) of a wafer process in a method for manufacturing a semiconductor integrated circuit device (STI preceding process) according to another embodiment hereof.
Figure 15:
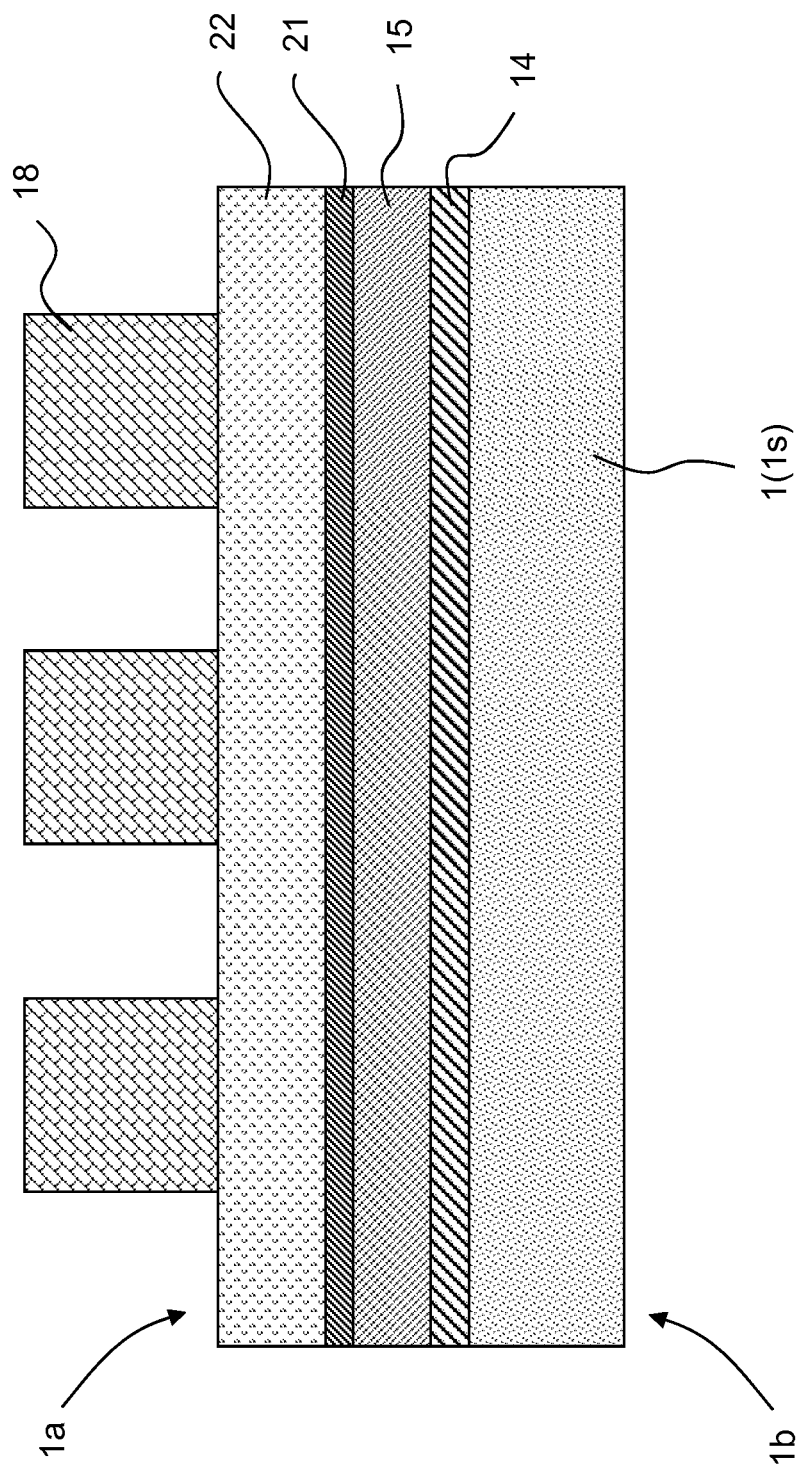
FIG. 15 is a sectional view of the wafer-inward region for explaining an important part (the step of forming a resist pattern for trench formation) of the wafer process in the method for manufacturing a semiconductor integrated circuit device (STI preceding process) according to the embodiment hereof.
Figure 16:
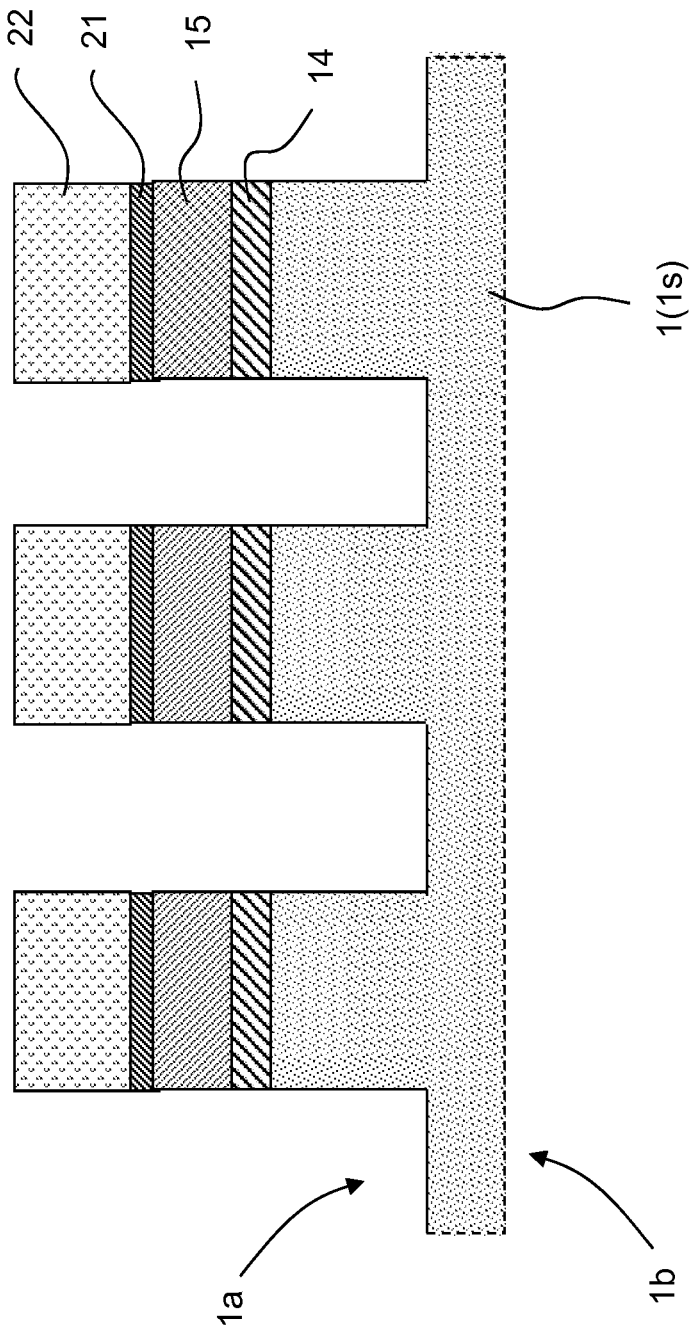
FIG. 16 is a sectional view of the wafer-inward region for explaining an important part (the step of trench formation) of the wafer process in the method for manufacturing a semiconductor integrated circuit device (STI preceding process) according to the embodiment.
Figure 17:
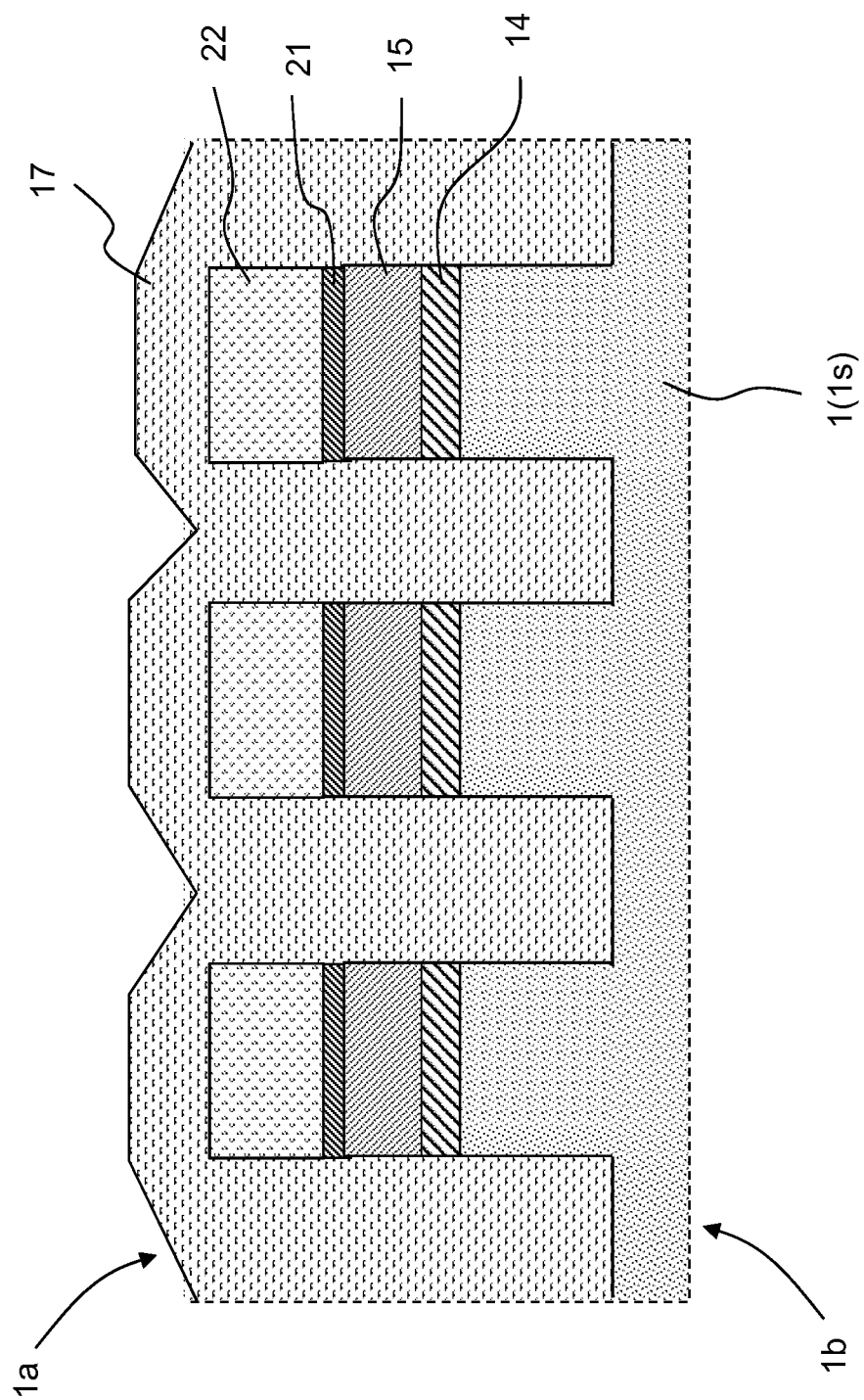
FIG. 17 is a sectional view of the wafer-inward region for explaining an important part (the step of burying an STI insulative film) of the wafer process in the method for manufacturing a semiconductor integrated circuit device (STI preceding process) according to the embodiment.
Figure 20:
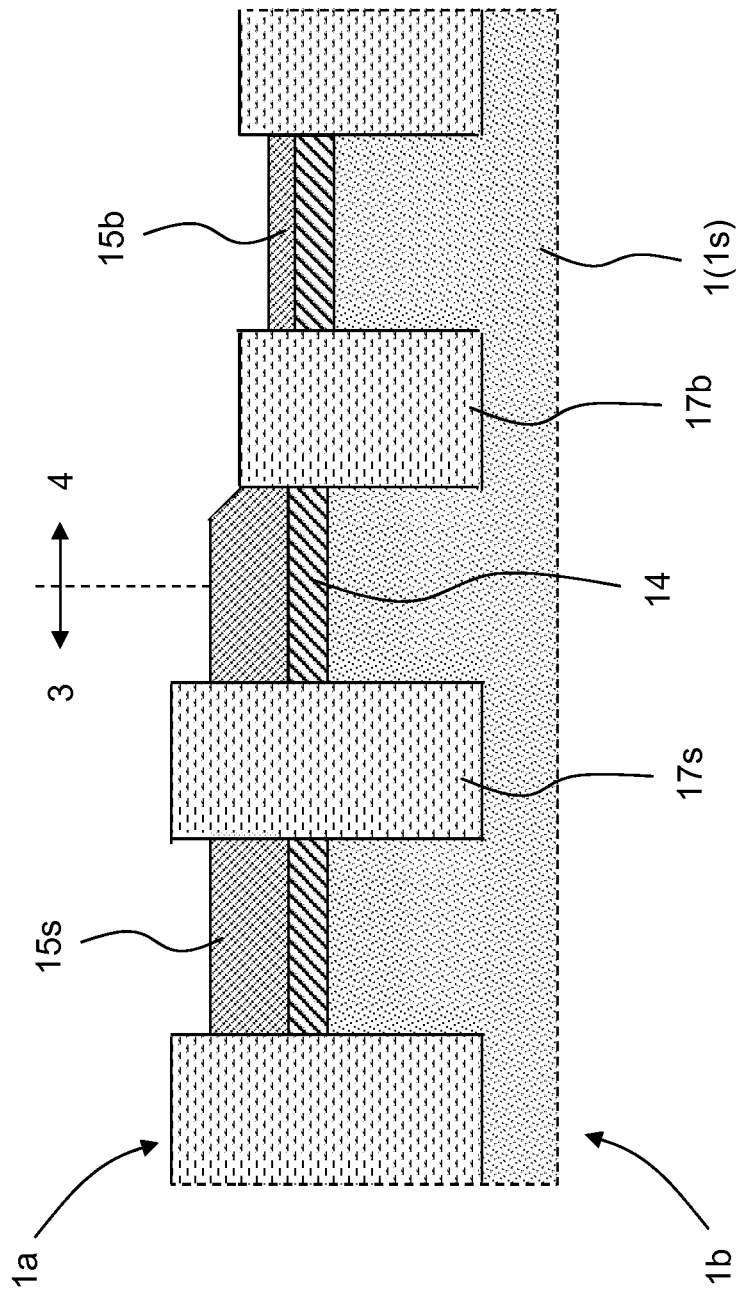
FIG. 20 is a sectional view of the wafer-inward region for explaining an important part (step of CMP and removal of silicon nitride film, etc.) of the wafer process in the method for manufacturing a semiconductor integrated circuit device (STI preceding process) according to the embodiment.
Figure 21:
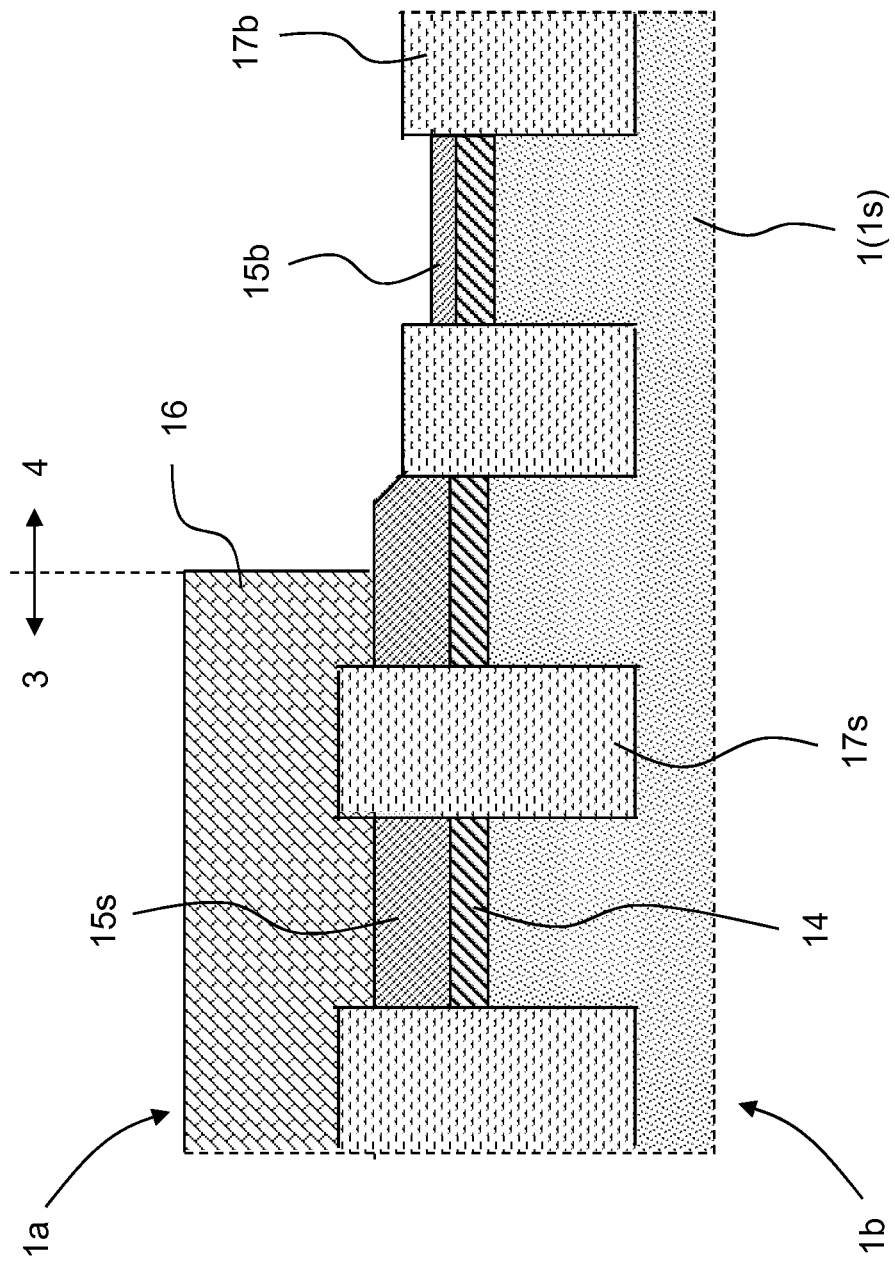
FIG. 21 is a sectional view of the wafer-inward region for explaining an important part (the step of processing a resist film for removal of BOX & SOI layers) of the wafer process in the method for manufacturing a semiconductor integrated circuit device (STI preceding process) according to the embodiment.
Figure 22:
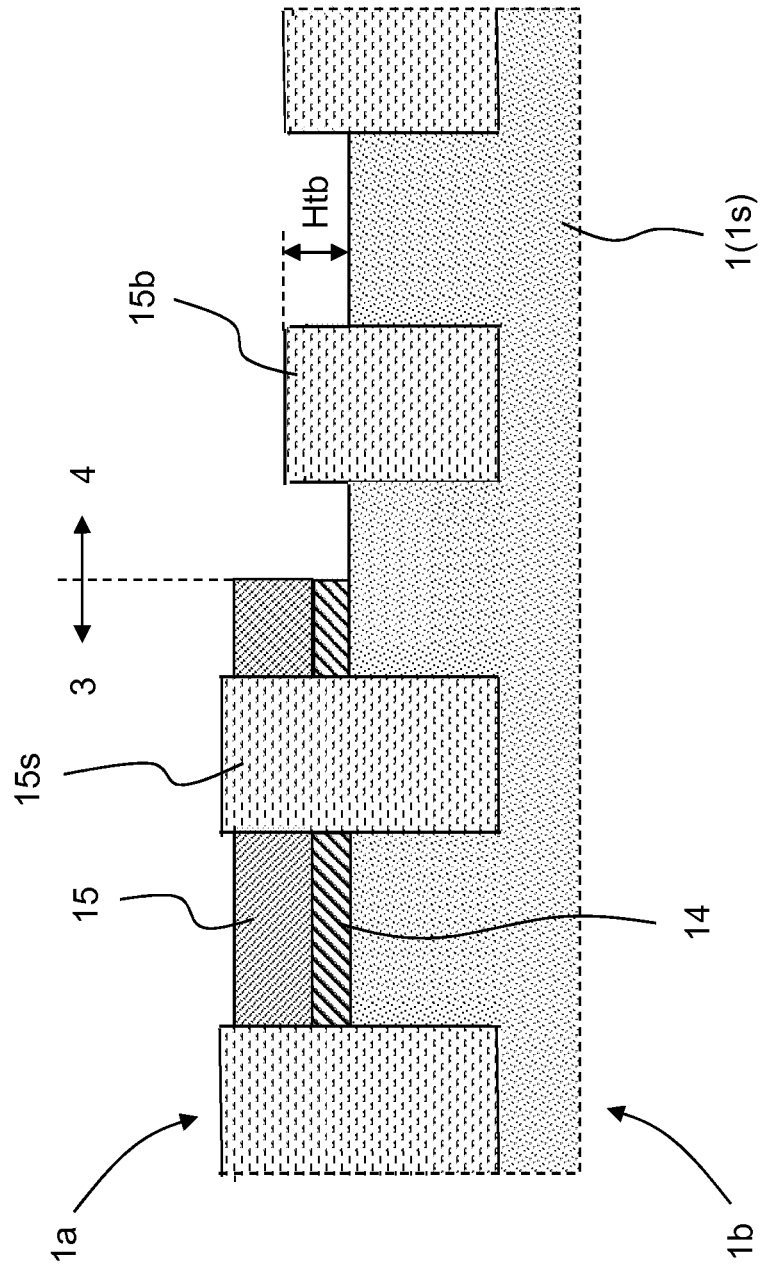
FIG. 22 is a sectional view of the wafer-inward region for explaining an important part (BOX & SOI layers-removing step) of the wafer process in the method for manufacturing a semiconductor integrated circuit device (STI preceding process) according to the embodiment.

FIG. 14 is a sectional view of the wafer-inward region for explaining an important part (the step of SOI wafer introduction) of a wafer process in a method for manufacturing a semiconductor integrated circuit device (STI preceding process) according to another embodiment hereof. FIG. 15 is a sectional view of the wafer-inward region for explaining an important part (the step of forming a resist pattern for trench formation) of the wafer process in the method for manufacturing a semiconductor integrated circuit device (STI preceding process) according to the embodiment. FIG. 16 is a sectional view of the wafer-inward region for explaining an important part (the step of trench formation) of the wafer process in the method for manufacturing a semiconductor integrated circuit device (STI preceding process) according to the embodiment. FIG. 17 is a sectional view of the wafer-inward region for explaining an important part (the step of burying an STI insulative film) of the wafer process in the method for manufacturing a semiconductor integrated circuit device (STI preceding process) according to the embodiment. FIG. 18 is a sectional view of the wafer-inward region for explaining an important part (the step of forming a resist pattern for reverse oxide film etching) of the wafer process in the method for manufacturing a semiconductor integrated circuit device (STI preceding process) according to the embodiment. FIG. 19 is a sectional view of the wafer-inward region for explaining an important part of the wafer process (the step of reverse oxide film etching) in the method for manufacturing a semiconductor integrated circuit device (STI preceding process) according to the embodiment. FIG. 20 is a sectional view of the wafer-inward region for explaining an important part (step of CMP and removal of silicon nitride film, etc.) of the wafer process in the method for manufacturing a semiconductor integrated circuit device (STI preceding process) according to the embodiment. FIG. 21 is a sectional view of the wafer-inward region for explaining an important part (the step of processing a resist film for removal of BOX & SOI layers) of the wafer process in the method for manufacturing a semiconductor integrated circuit device (STI preceding process) according to the embodiment. FIG. 22 is a sectional view of the wafer-inward region for explaining an important part (BOX & SOI layers-removing step) of the wafer process in the method for manufacturing a semiconductor integrated circuit device (STI preceding process) according to the embodiment. The important parts of the wafer process in the method for manufacturing a semiconductor integrated circuit device (STI preceding process) according to the embodiment will be described with reference to the drawings.

First, a P-type SOI semiconductor wafer 1 similar to the wafer shown in FIG. 1 is prepared as shown in FIG. 14.

Then, a pad silicon oxide film 21 having a thickness of e.g. about 10 nm is formed almost all over the surface of the wafer 1 on the side of the front face 1a by e.g. CVD (Chemical Vapor Deposition), as shown in FIG. 15. Subsequently, a silicon nitride film 22 for a stopper of CMP (Chemical Mechanical Polishing) is formed by e.g. CVD almost all over the surface of the wafer 1 on the side of the front face 1a to have a thickness of e.g. about 60 nm. Then, a resist film 18 for trench formation is formed almost all over the surface of the wafer 1 on the side of the front face 1a; the resist film 18 for trench formation is patterned by e.g. a typical photolithography.

Subsequently, as shown in FIG. 16, a trench which will form an STI region is formed by e.g. anisotropic dry etching while using, as a mask, the patterned resist film 18 for trench formation. In this embodiment, the trench extends through the BOX layer 14 and reaches the inside of the substrate 1s. By making the arrangement like this, the harmonization with the depth of the trench in the bulk device region 4 can be ensured.

Also, the mutual isolation between back-gate regions in the SOI device region 3 can be enhanced.

Subsequently, a liner silicon oxide film is formed on a semiconductor surface exposed on the side of the front face 1a of the wafer 1 by thermal oxidation, for example (which is not shown to avoid increasing the complexity of the drawing).

Then, as shown in FIG. 17, a silicon oxide film is formed as an STI insulative film 17 almost all over the surface of the wafer 1 on the side of the front face 1a by e.g. HDP (High Density Plasma)-CVD (the silicon oxide film may be formed according to another method).

Subsequently, as shown in FIG. 18, a resist film 19 for reverse oxide film etching is formed almost all over the surface of the wafer 1 on the side of the front face 1a, and patterned by e.g. the typical photolithography, thereby forming a resist film 19 for reverse oxide film etching. In this case, in order to relatively increase the amount of polishing the STI insulative film 17 of the bulk device region 4, the reverse-opening-size-reduction rate in the bulk device region 4 is made a relatively small value according to the bulk-device-side-etching-amount-increasing method, which includes to make the rate a negative value, namely to make the opening wider than the corresponding active region). Substantially, the STI insulative film 17 is etched back by e.g. anisotropic dry etching while using as a mask, the patterned resist film 19 for reverse oxide film etching. After that, the disused resist film 19 for reverse oxide film etching is removed by e.g. ashing.

Next, CMP is executed on the side of the front face 1a of the wafer 1, whereby the front face of the wafer is planarized. Then, silicon nitride film 22 is removed by e.g. wet etching, in which the etchant used therefor is e.g. a hot phosphoric acid. Subsequently, the pad silicon oxide film 21 is removed by e.g. wet etching, in which the etchant is e.g. a hydrofluoric acid-based etchant. As a result, the structure as shown in FIG. 20 is obtained. It is clear from FIG. 20 that the height of the top of the STI region 17b (second STI region) of the bulk device region is lower than the top of the STI region 17s (first STI region) of the SOI device region. In addition, the SOI layer 15b of the bulk device region is smaller in thickness than the SOI layer 15s of the SOI device region. This is because the amount of etching back of the STI insulative film 17 in the bulk device region 4 is larger in the reverse oxide film etching.

Next, as shown in FIG. 21, a resist film 16 for bulk device region definition is formed almost all over the surface of the wafer 1 on the side of the face 1a thereof. The resist film 16 for bulk device region definition is patterned by e.g. a typical photolithography. Subsequently, the patterned resist film 16 for bulk device region definition is used as a mask to remove the SOI layer 15 in the bulk device region 4 and in the wafer-peripheral region 6 by e.g. dry etching, in which e.g. a halogen-based etching gas is used. Then, the BOX layer 14 is removed in the bulk device region 4 and in the wafer-peripheral region 6 by e.g. wet etching, in which e.g. a hydrofluoric acid-based etchant is used. After that, the disused resist film 16 for bulk device region definition is removed by e.g. ashing, and then the structure as shown in FIG. 22 is obtained.

The STI insulative film 17 is buried in each trench as shown in FIG. 22 the STI regions 17, 17s and 7b, i.e. the first and second STI regions 17s and 17b are formed. In this case, as clear from FIG. 22, an STI height Htb (i.e. bulk device region STI height) in the bulk device region 4 is relatively low with respect to the front face of the semiconductor substrate 1s. This is useful to avoid that a step deteriorates the effect of the photolithography.

The exposure of the resist film 16 for bulk device region definition in the wafer-peripheral region 6 has been described in detail in the sections 3 and 4, and therefore the description thereof is omitted here.

The subsequent steps are the same as those described in the section 1 and therefore, the description thereof is not repeated.

The STI preceding process is arranged based on the method such that an STI region is formed ahead, which has a track record in conventional use and therefore, the STI preceding process has the advantage that the high process reliability is achieved.

6. Supplementary Explanation Concerning the Embodiments (Including the Modifications), and General Consideration (with Reference to FIGS. 23 to 26, Mainly)

Figure 23:
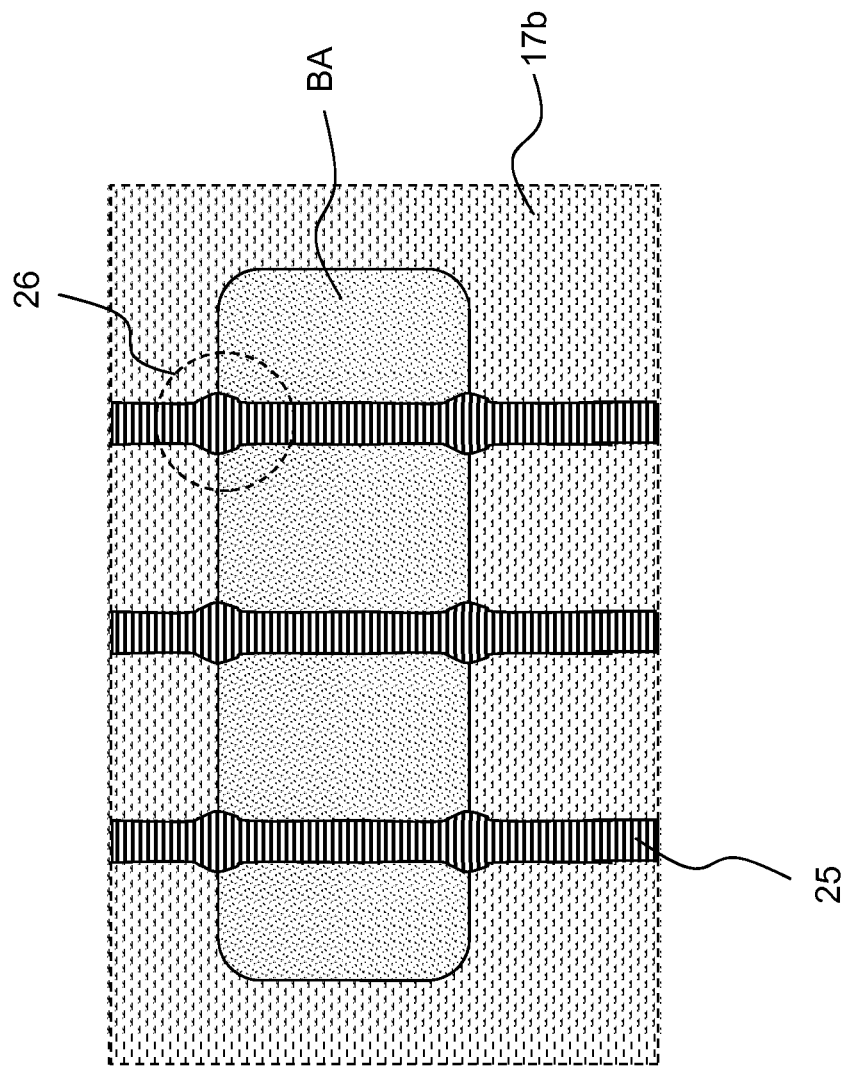
FIG. 23 is a wafer top view showing an example of a harmful effect on a boundary portion of the bulk device region and the STI region, and the like in the case where the height Dtb of the bulk device region STI is high (at the time of the completion of a gate electrode-processing step)
Figure 24:
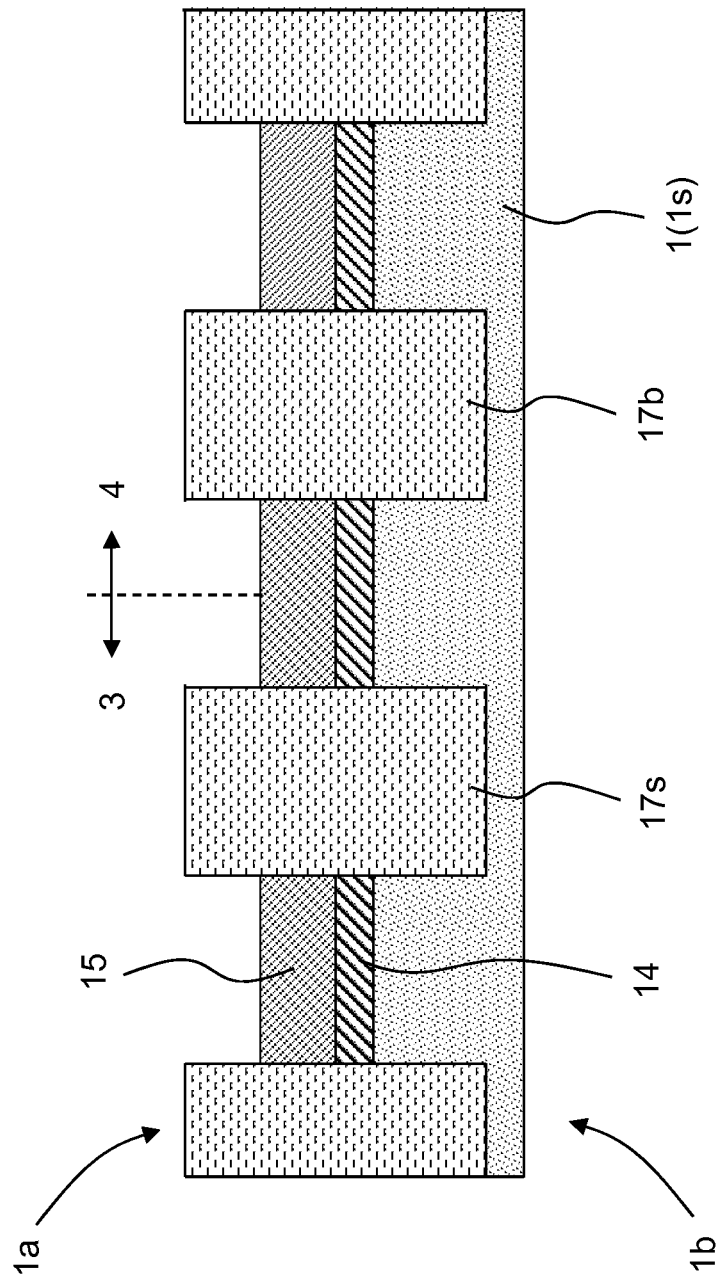
FIG. 24 is a sectional view showing a wafer-inward region in STI forming process in a simple STI preceding process which is a comparative example (trench-burying step)
Figure 25:
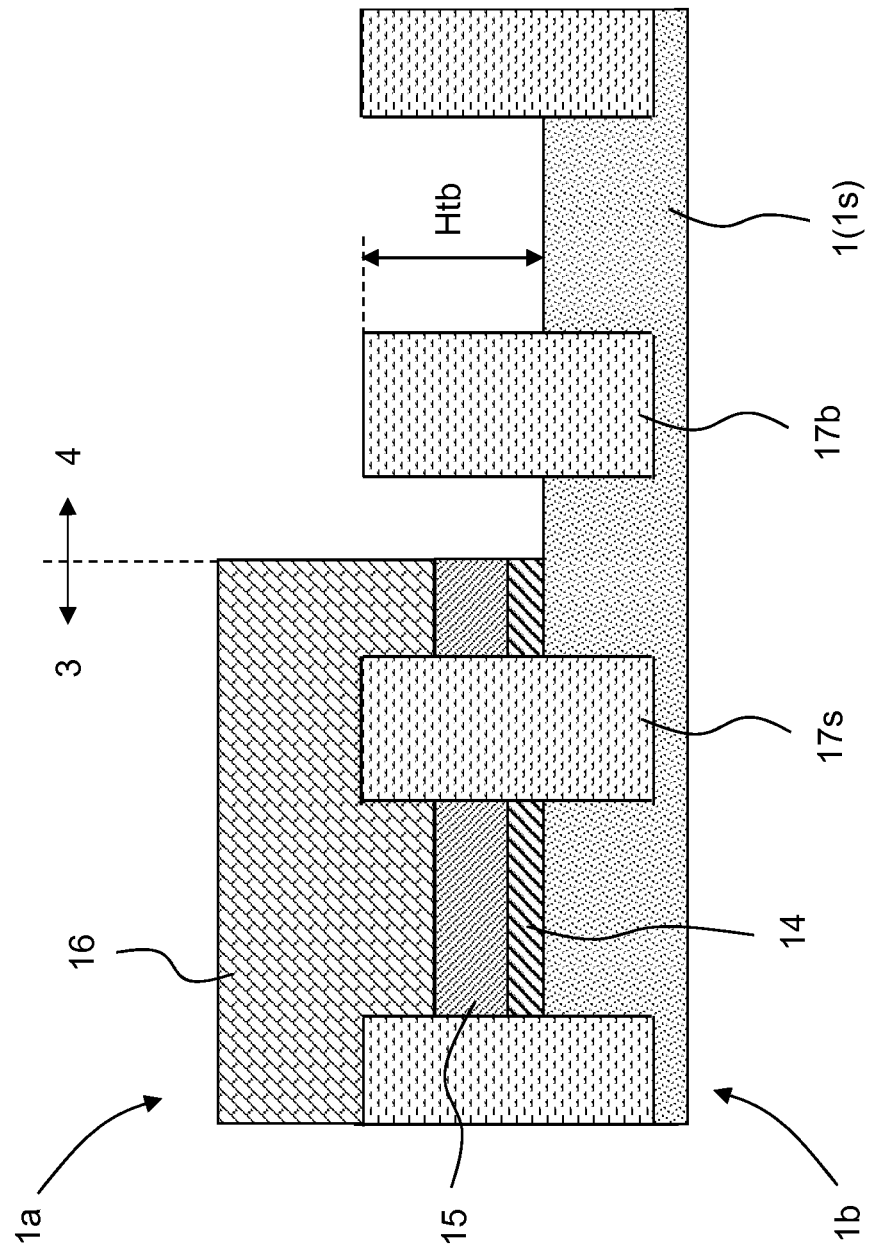
FIG. 25 is a sectional view showing the wafer-inward region in the STI forming process in the simple STI preceding process which is a comparative example (BOX & SOI layers-removing step)
Figure 26:
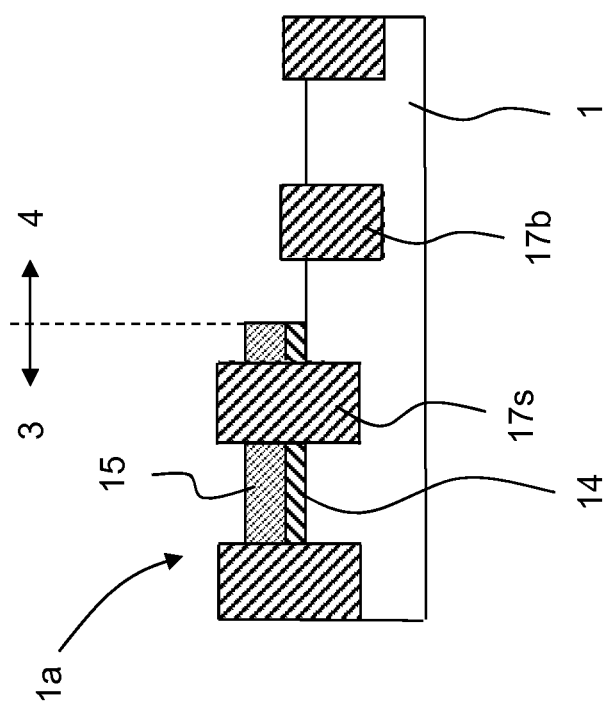
FIG. 26 is a wafer sectional view for explaining the outline of the method for manufacturing a semiconductor integrated circuit device according to one embodiment hereof (BOX & SOI layers-removing preceding process)

FIG. 23 is a wafer top view showing an example of a harmful effect on a boundary portion of the bulk device region and the STI region, and the like in the case where the height Dtb of the bulk device region STI is high (at the time of the completion of a gate electrode-processing step). FIG. 24 is a sectional view showing a wafer-inward region in STI forming process in a simple STI preceding process which is a comparative example (trench-burying step), FIG. 25 is a sectional view showing the wafer-inward region in the STI forming process in the simple STI preceding process which is a comparative example (BOX & SOI layers-removing step). FIG. 26 is a wafer sectional view for explaining the outline of the method for manufacturing a semiconductor integrated circuit device according to one embodiment hereof (BOX & SOI layers-removing preceding process). The supplementary explanation concerning the embodiments (including modifications), and the general consideration thereof will be made with reference to the drawings.

(1) General Consideration on the Microfabrication of CMOS Integrated Circuits

With the progress of microfabrication of CMOS integrated circuits, the speedup of LSI (Large Scale Integration) and increase in integration thereof have been advanced. In parallel with this, it has been a prerequisite to reduce the power consumption to prevent the power consumption by a chip from exceeding the capacity of cooling it. For this purpose, it is necessary to lower a source voltage, and the transfer from conventional bulk structure transistors to transistors of total depletion type SOI structure which is advantageous for a low power operation, and transistors of a multi-gate structure (so-called FIN structure) has been considered.

One of possible device structures for such transistors is specifically the BOX type SOI substrate. Along such line, the development of a logic circuit with an ultra-low voltage operation (the operation voltage is e.g. 0.4 volts or less, approximately) has been progressed.

In the case of incorporating both of an SOI type transistor in a logic circuit part, and a bulk type transistor in a peripheral circuit part in an actual integrated circuit device, it is necessary to form the SOI device region and the bulk device region separately in its manufacturing process. Specifically, a process such that an SOI type semiconductor wafer is used, and an STI device isolation structure is formed both in the SOI device region and the bulk device region is required. The above-described embodiments (including the modifications) are arranged to solve the various problems in forming an STI device isolation structure.

(2) Comparative Example and Concrete Description of the Problems Thereof (with Reference to FIGS. 23 to 25, Mainly)

The comparative example is in connection with a conventionally often used "STI preceding and uniform reduction reverse oxide film etching method". With the exception that the uniform reduction method is applied in reverse oxide film etching, the method is the same as the process described in the section 5, and the reverse oxide film etching included in the method is the same as the process described in the section 1. Therefore, only parts of the comparative examples corresponding to parts of the process described with reference to FIGS. 21 and 22 in the section 5 will be described below.

In the case of applying the uniform reduction method to steps associated with FIGS. 18 and 19, the structure as shown in FIG. 24 is obtained, which corresponds to FIG. 20. Specifically, as shown in FIG. 24, the top (upper face) of the STI region 17b (second STI region) of the bulk device region, and the top (upper face) of the STI region 17s (first STI region) of the SOI device region coincide with each other in height. Also, their lower faces are located at the same height.

Next, as shown in FIG. 25, a resist film 16 for bulk device region definition is formed almost all over the surface of the wafer 1 on the side of the front face 1a in the same way as described with reference to FIG. 21, and The resist film 16 for bulk device region definition is patterned by e.g. a typical photolithography. Subsequently, the patterned resist film 16 for bulk device region definition is used as a mask to remove the SOT layer 15 in the bulk device region 4 and in the wafer-peripheral region 6 by e.g. dry etching, in which e.g. a halogen-based etching gas is used. Then, the BOX layer 14 is removed in the bulk device region 4 and in the wafer-peripheral region 6 by e.g. wet etching, in which e.g. a hydrofluoric acid-based etchant is used. As clear from FIG. 25, the height Htb of the bulk device region STI in the comparative example is relatively higher than that in the case of the sections 1 and 5. If in this condition, e.g. the patterning of a gate electrode as described with reference to FIG. 6 is executed, an abnormality is produced in the width of the gate electrode 25 in a boundary portion (i.e. the STI stepped portion 26) between the active region BA of the bulk device region 4 with significantly large steps and the STI region 17 surrounding it as shown in FIG. 23.

(3) Description of the Outline of the Method for Manufacturing a Semiconductor Integrated Circuit Device According to One Embodiment Hereof (BOX & SOI Layers-Removing Preceding Process) (with Reference to FIG. 26, Mainly)

In contrast, in the method for manufacturing a semiconductor integrated circuit device (BOX & SOI layers-removing preceding process) according to the embodiment, the BOX layer 14 and the SOI layer 15 are removed before forming the STI region 17s in the SOI device region 3 to extend through the BOX layer 14, as shown in FIG. 26. By making the arrangement like this, a surface step around the STI region 17b e.g. in the bulk device region 4 can be made smaller, as shown in FIG. 5.

In addition, the method for manufacturing a semiconductor integrated circuit device (BOX & SOI layers-removing preceding process) according to the embodiment is not limited to the formation of the STI region 17s which extends through the BOX layer 14, and it is effective to the case of forming the STI region 17s which does not extend through the BOX layer 14 likewise. In this case, there is an advantage as follows. If the method is arranged not to have the step for forming an epitaxial semiconductor layer at least on the bulk device region after the BOX & SOI layers-removing step and before the STI region forming step in addition to the above-described conditions, the process can be simplified. In other words, the method is advantageous in that there is no need to have a complicated epitaxial process and the like to raise the height of the substrate upper face in the bulk side.

7. Summary

The invention made by the inventor has been concretely described above based on the embodiments. However, the invention is not limited to the embodiments. It is obvious that various changes and modifications may be made without departing from the subject matter thereof.

While the embodiments have been described specifically while chiefly taking the gate-first method as an example, the invention is not limited to the embodiments. It is obvious that the invention is applicable to FUSI process, High-k first & gate last method, High-k & gate last method, P-side gate last hybrid method, etc.

What is claimed is:

1. A manufacturing method for semiconductor integrated circuit device comprising of steps:
    (a) removing an SOI layer and a BOX layer from an entire region of a bulk device region in each chip region on a first principal face side of an SOI type semiconductor wafer, portions of the SOI and BOX layers being retained in an SOI device region in each chip region on the first principal face side of the SOI type semiconductor wafer;
    (b) after the step (a), forming a first STI region to extend through the retained portion of the BOX layer in the SOI device region in each chip region, and forming a second STI region in the bulk device region in each chip region on the first principal face side of the SOI type semiconductor wafer; and
    (c) after the step (b), forming MISFETs in the SOI device region and the bulk device region, respectively,
    wherein the step (b) comprises:
        (b1) etching the retained portion of the BOX layer in the SOI device region in each chip region to form a first trench that extends through the retained portion of the BOX layer in each SOI device region, and etching the SOI type semiconductor wafer in the bulk region in each chip region to form a second trench on the first principal face side of the SOI type semiconductor wafer in each bulk region;
        (b2) forming an STI insulative film in the first and second trenches and over the first principal face side of the SOI type semiconductor wafer; and
        (b3) performing chemical mechanical polishing (CMP) on the first principal face side of the SOI type semiconductor wafer to form the first and second STI regions in the first and second trenches, respectively.

2. The method for manufacturing a semiconductor integrated circuit device according to claim 1, wherein a lower end portion of the second STI region is lower than that of the first STI region.

3. The method for manufacturing a semiconductor integrated circuit device according to claim 2, wherein the step (c) includes:
    (c1) patterning a gate electrode of the MISFET.

4. The method for manufacturing a semiconductor integrated circuit device according to claim 3, wherein a step of forming an epitaxial semiconductor layer at least on the bulk device region is not included after the step (a) and before the step (b).

5. The method for manufacturing a semiconductor integrated circuit device according to claim 4, wherein the step (b) further includes:
    forming an alignment mark to use in the step (c) in a dicing region on the first principal face side of the SOI type semiconductor wafer, the region having the SOI and BOX layers removed therefrom.

6. The method for manufacturing a semiconductor integrated circuit device according to claim 5, wherein the alignment mark is mainly composed of an STI insulative film formed concurrently with formation of the first and second STI regions.

7. The method for manufacturing a semiconductor integrated circuit device according to claim 4, wherein the step (a) further includes: removing the SOI and BOX layers in a wafer-peripheral region on the first principal face side of the SOI type semiconductor wafer.

8. The method for manufacturing a semiconductor integrated circuit device according to claim 7, wherein a part to remove the SOI and BOX layers from the wafer-peripheral region is defined by peripheral exposure.

9. The method for manufacturing a semiconductor integrated circuit device according to claim 7, wherein a part to remove the SOI and BOX layers from the wafer-peripheral region is defined by exposure using a mask pattern.

10. The method for manufacturing a semiconductor integrated circuit device according to claim 8, wherein the peripheral exposure is executed before a primary exposure for defining the bulk device region in each chip region.

11. The method for manufacturing a semiconductor integrated circuit device according to claim 1, wherein the step (c) includes forming source and drain regions of the MISFET in the SOI device region in the SOI layer, and forming source and drain regions of the MISFET in the bulk device region within the semiconductor wafer.

12. The method for manufacturing a semiconductor integrated circuit device of claim 1, wherein
    a bottom surface of the first STI region is closer to the first principal face of the SOI type semiconductor wafer than a bottom surface of the second STI region, and
    a top surface of the first STI region is farther from the first principal face of the SOI type semiconductor wafer than a top surface of the second STI region.

13. The method of manufacturing a semiconductor integrated circuit device according to claim 1, wherein the removing the SOI and BOX layers in the step (a) is such that the first principal face of the SOI type semiconductor wafer is exposed in the bulk device region prior to the etching of the step (b1).

14. The method of manufacturing a semiconductor integrated circuit device according to claim 13, wherein the step (c) comprises:
    forming a gate insulating film of the MISFET in the bulk device region in contact with the exposed first principal face of the SOI type semiconductor wafer; and
    forming a gate insulating film of the MISFET in the SOI device region in contact with an upper surface of the retained SOI layer.

* * * * *